(12) United States Patent
Kim et al.

(10) Patent No.: US 10,264,174 B2
(45) Date of Patent: Apr. 16, 2019

(54) PHOTOGRAPHING APPARATUS AND FOCUS DETECTION METHOD USING THE SAME

(71) Applicant: SAMSUNG ELECTRONICS CO., LTD., Suwon-si, Gyeonggi-do (KR)

(72) Inventors: Il-do Kim, Bucheon-si (KR); Jeong-won Lee, Seongnam-si (KR); Woo-seok Choi, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 142 days.

(21) Appl. No.: 15/213,673

(22) Filed: Jul. 19, 2016

(65) Prior Publication Data

US 2017/0163873 A1   Jun. 8, 2017

Related U.S. Application Data

(60) Provisional application No. 62/264,476, filed on Dec. 8, 2015.

(30) Foreign Application Priority Data

Feb. 25, 2016   (KR) ........................ 10-2016-0022830

(51) Int. Cl.
*H04N 5/232* (2006.01)
*H04N 5/369* (2011.01)

(52) U.S. Cl.
CPC ... *H04N 5/232122* (2018.08); *H04N 5/23212* (2013.01); *H04N 5/3696* (2013.01); *H04N 5/36961* (2018.08)

(58) Field of Classification Search
CPC ............ H04N 5/23212; H04N 5/3696; H04N 5/232122; H04N 5/36961
See application file for complete search history.

(56) References Cited

U.S. PATENT DOCUMENTS

| | | | |
|---|---|---|---|
| 8,976,289 B2 | 3/2015 | Iwasaki | |
| 9,137,436 B2 | 9/2015 | Ohara | |
| 2009/0096886 A1* | 4/2009 | Kusaka | H04N 5/23212 348/222.1 |
| 2009/0096903 A1* | 4/2009 | Kusaka | H04N 5/23212 348/302 |
| 2012/0033128 A1* | 2/2012 | Nagano | G02B 7/34 348/349 |

(Continued)

FOREIGN PATENT DOCUMENTS

JP   2014-160230   9/2014

*Primary Examiner* — Daniel M Pasiewicz
(74) *Attorney, Agent, or Firm* — Nixon & Vanderhye, P.C.

(57) ABSTRACT

A photographing apparatus for automatically detecting a focus via a phase difference detection scheme, the photographing apparatus including an image sensor comprising a plurality of phase difference pixels and configured to acquire an image of a subject; an addition processor configured to add output signals of the plurality of phase difference pixels; a controller configured to detect the focus of the image based on output signals of the plurality of phase difference pixels, and to set an addition range of the plurality of phase difference pixels added by the addition processor based on information of the detected focus and information of the acquired image of the subject.

18 Claims, 23 Drawing Sheets

(56) References Cited

U.S. PATENT DOCUMENTS

| | | | |
|---|---|---|---|
| 2013/0258168 A1* | 10/2013 | Aoki | G02B 7/34 |
| | | | 348/349 |
| 2014/0204241 A1 | 7/2014 | Ohara | |
| 2015/0146052 A1* | 5/2015 | Sawadaishi | G02B 7/34 |
| | | | 348/266 |
| 2015/0296125 A1* | 10/2015 | Kusaka | G02B 7/34 |
| | | | 348/349 |
| 2016/0205315 A1* | 7/2016 | Irie | G02B 7/28 |
| | | | 348/353 |
| 2016/0277669 A1* | 9/2016 | Kusaka | G02B 7/34 |
| 2016/0353010 A1* | 12/2016 | Tanaka | H04N 5/3656 |
| 2017/0064185 A1* | 3/2017 | Chikano | H04N 5/23212 |

* cited by examiner

FIG. 14A
FIG. 14B
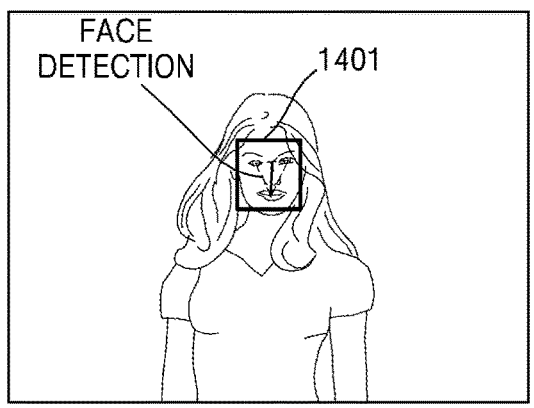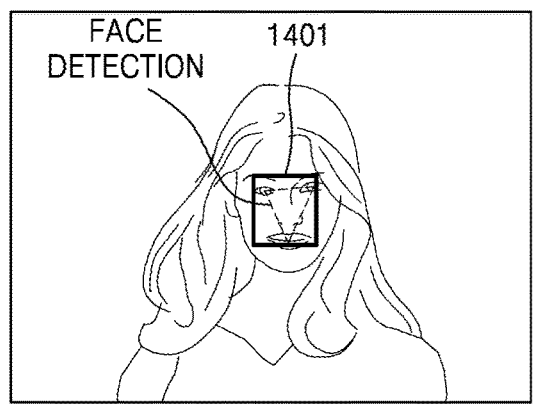

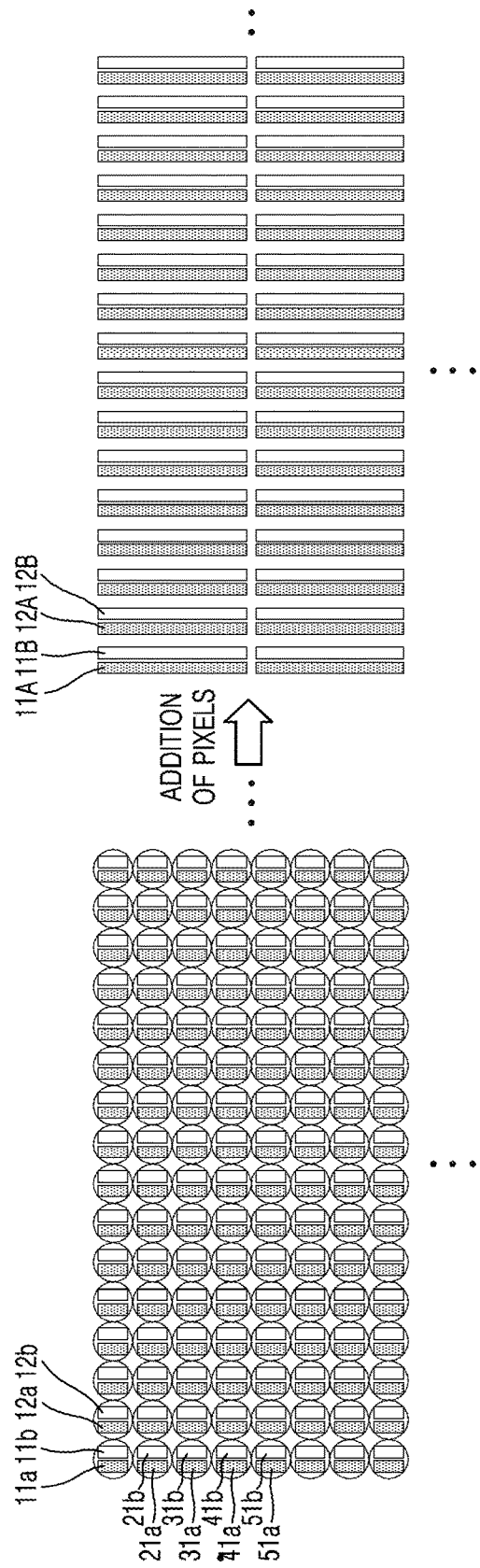

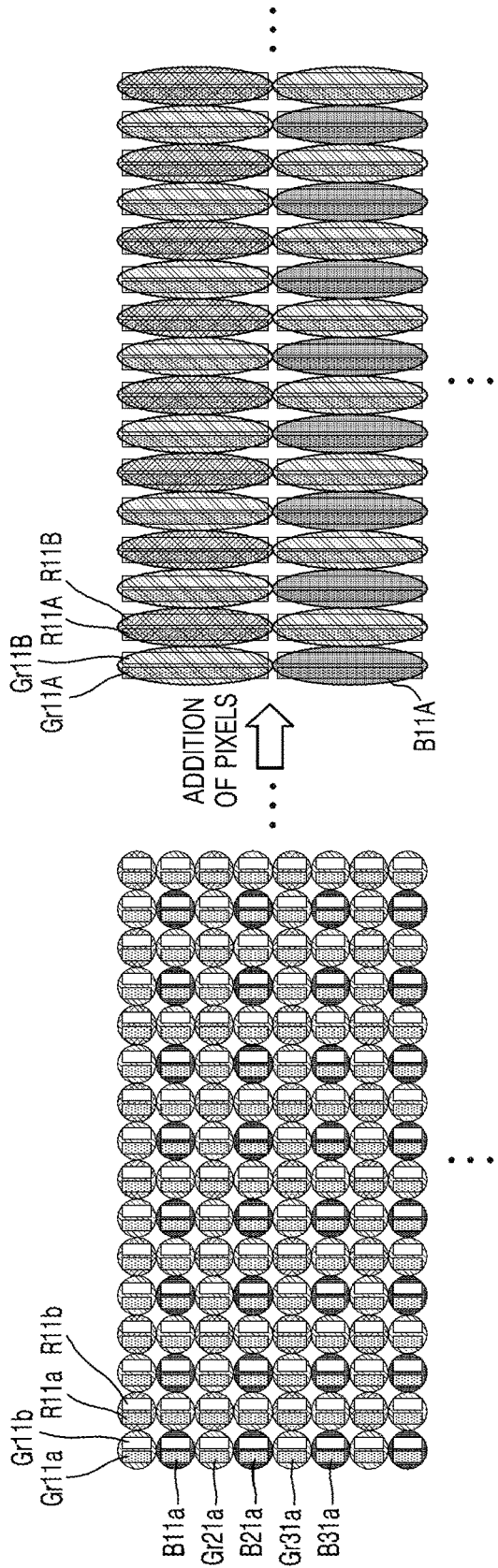

PHOTOGRAPHING APPARATUS AND FOCUS DETECTION METHOD USING THE SAME

CROSS-REFERENCE TO RELATED APPLICATION

This application is based on and claims priority under 35 U.S.C. § 119 to U.S. Provisional Patent Application No. 62/264,476, filed on Dec. 8, 2015, in the U.S. Patent and Trademark Office, and Korean Patent Application No. 10-2016-0022830, filed on Feb. 25, 2016, in the Korean Intellectual Property Office, the disclosures of which are incorporated by reference herein in their entireties.

BACKGROUND

1. Field

The present disclosure relates to a photographing apparatus and a method of operating the photographing apparatus, and for example, to a photographing apparatus that automatically detects a focus by using a phase difference detection scheme.

2. Description of Related Art

Many photographing apparatuses generally have an auto-focus (hereinafter referred to as "AF") function for automatically focusing on a subject to be photographed. A general method of implementing the AF function uses a through the lens (TTL) scheme wherein light bouncing off the subject is received through a photographing lens in a charge-coupled device (CCD), etc., the photographing lens moving along an optical axis direction, contrast with respect to light bouncing off the subject is repeatedly determined, and a lens location when the contrast is the highest and a focusing location are determined. As many photographing apparatuses have an AF function, even a beginner user may acquire a high quality photographing image by focusing on a desired subject.

However, in the case of low light level (LLT), motion of the subject, etc., a highly accurate AF may not be detected via a conventional RAF scheme.

SUMMARY

A photographing apparatus capable of setting an addition range of a plurality of phase difference pixels on the basis of information regarding a focus detected through the phase difference pixels and subject image analysis information, thereby finally detecting a highly reliable focus, and a method of operating the photographing apparatus are provided.

Additional aspects will be set forth in part in the description which follows and, in part, will be apparent from the description.

According to an aspect of an example embodiment, a photographing apparatus for automatically detecting a focus via a phase difference detection scheme includes an image sensor comprising a plurality of phase difference pixels and configured to acquire an image of a subject; an addition processor configured to add output signals of the plurality of phase difference pixels; a controller configured to detect the focus of the image based on output signals of the plurality of phase difference pixels, and set an addition range of the plurality of phase difference pixels added by the addition processor based on information of the detected focus and information of the acquired image of the subject.

According to an aspect of another example embodiment, a method of automatically detecting a focus via a phase difference detection scheme includes acquiring an image of a subject from an image sensor comprising a plurality of phase difference pixels; detecting the focus of the image based on output signals of the plurality of phase difference pixels; setting an addition range of the plurality of phase difference pixels based on information of the detected focus and information of the acquired image of the subject; and adding output signals of the plurality of phase difference pixels.

According to an aspect of another example embodiment, a non-transitory computer-readable recording medium storing a program for causing a computer to perform the method is provided.

BRIEF DESCRIPTION OF THE DRAWINGS

These and/or other aspects will become apparent and more readily appreciated from the following detailed description, taken in conjunction with the accompanying drawings, in which like reference numerals refer to like elements, and wherein:

FIGS. 14A and 14B are diagrams illustrating an example of controlling a size of an ROI based on an image of a subject according to an example embodiment;

FIGS. 18A and 18B are diagrams illustrating an example of addition of output signals of phase difference pixels according to an example embodiment; and FIGS. 19A and 19B are diagrams illustrating an example of addition of output signals of phase difference pixels to which weights are added according to an example embodiment.

DETAILED DESCRIPTION

Figure 1:
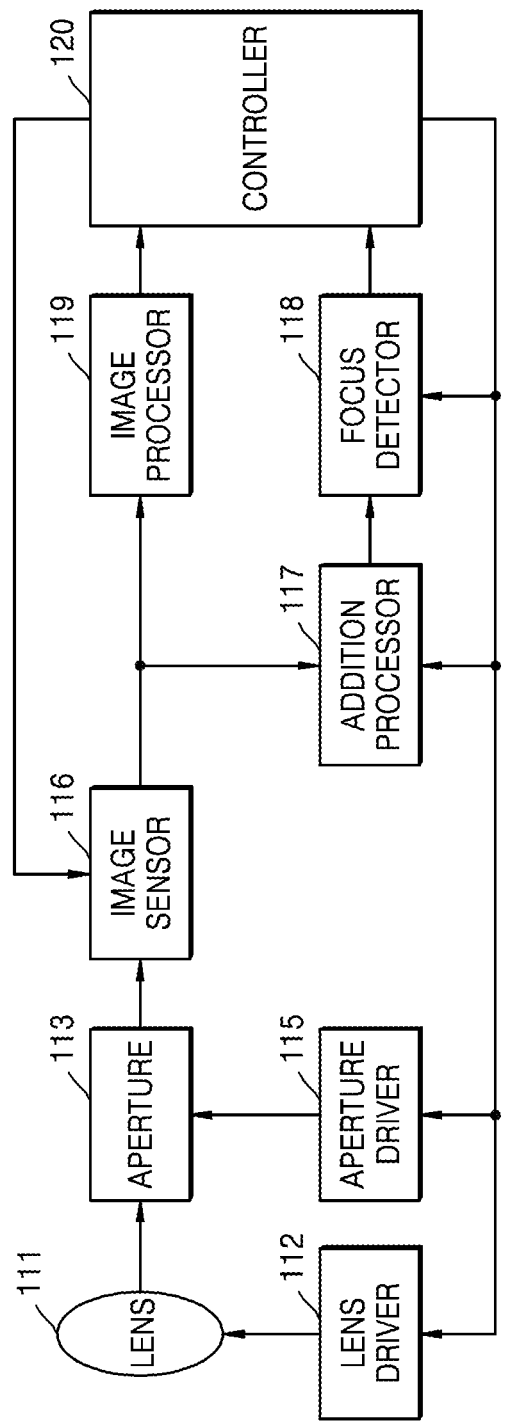
FIG. 1 is a block diagram illustrating an example structure of a photographing apparatus according to an example embodiment.

Terminology used in this description will be described briefly, and then embodiments of the present disclosure will be described in detail.

For the terminology used in this description, general terms currently in wide use are selected wherever possible in consideration of functions in the present disclosure, but may vary according to intentions of those of ordinary skill in the art, precedent cases, the advent of new technology, and so on. In particular, some terms may be arbitrarily selected by the applicant, and in such cases, the detailed meanings of the terms will be stated in the corresponding description. Therefore, the terms used in this description should be defined based on the meanings of the terms together with the description throughout the description rather than their simple names.

Throughout the description, when a portion "includes" an element, unless otherwise described, another element may be further included, rather than the presence of other elements being excluded. Also, terms such as "portion," "module," etc. used herein indicate a unit for processing at least one function or operation, in which the unit and the block may be embodied as hardware or software or may be embodied by a combination of hardware and software.

Reference will now be made in detail to embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects. Expressions such as "at least one of," when preceding a list of elements, modify the entire list of elements and do not modify the individual elements of the list.

PAF may refer, for example, to phase detection auto focus or phase difference auto focus below.

FIG. 1 is a block diagram illustrating an example structure of a photographing apparatus 100 according to an example embodiment.

Referring to FIG. 1, the photographing apparatus 100 may include a lens 111, a lens driver 112, an aperture 113, an aperture driver 115, an image sensor 116, an addition processor 117, a focus detector 118, an image processor 119, and a controller 120.

The photographing apparatus 100 may be implemented in various forms, such as a digital still camera which photographs a still image, a digital video camera which photographs a video, and so on. The photographing apparatus 100 may include a digital single-lens reflex (DSLR) camera, a mirrorless camera, or a smart phone but is not limited thereto. The photographing apparatus 100 according to an embodiment may include an apparatus in which a plurality of camera modules including a lens and an imaging device and photographing a subject and generating an image are mounted.

The lens 111 may include a plurality of lenses in a plurality of groups. A position of the lens 111 may be adjusted by the lens driver 112. The lens driver 112 may adjust the position of the lens 111 according to a control signal provided by the controller 130. The lens driver 112 may adjust a focal length and perform operations such as auto-focusing, zoom changing, focus changing, and so on by adjusting the position of the lens 111. A plurality of phase difference pixels may share the lens 111.

A degree of opening or closing of the aperture 113 may be adjusted by the aperture driver 115. The aperture 113 may adjust an amount of light incident on the image sensor 116.

An optical signal transmitted through the lens 111 and the aperture 113 may form an image of the subject on a light-receiving surface of the image sensor 116. The image sensor 116 may be a charge-coupled device (CCD) image sensor or a complementary metal oxide semiconductor (CMOS) image sensor (CIS) which converts the optical signal into an electric signal. A sensitivity of the image sensor 116, etc. may be adjusted by the controller 120. The controller 120 may control the image sensor 116 according to a control signal automatically generated by an image signal which is input in real time or a control signal manually input by a user's manipulation.

The addition processor 117 may add output signals of the plurality of phase difference pixels. The addition processor 117 may add the output signals as much as a range of necessary pixels for detection of a focus in order to increase reliability of the detection of the focus.

The focus detector 118 may detect a focus of an image based on the output signals of the plurality of phase difference pixels. The focus detector 118 may receive an image signal individually output from each of the phase difference pixels (including a first photoelectric conversion device and a second photoelectric conversion device). The focus detector 118 may determine a phase deviation value by performing a correlation calculation by using the output signals of the phase difference pixels. The focus detector 118 may determine a disparity as a shift amount of a pixel having a lowest correlation calculation value. The focus detector 118 may determine an amount of defocus based on the determined phase deviation value.

The focus detector 118 may first detect a first focus and then detect a second focus based on the added output signals of the phase difference pixels.

The image processor 119 may perform image signal processing by using a signal output from the image sensor 116. The image processor 119 may include an analog signal processor and an image signal processor.

The analog signal processor may perform noise reduction, gain adjustment, waveform standardization, analog-to-digital conversion, etc. on an analog signal supplied from the image sensor 116.

The image signal processor may be a signal processor for processing a special function on an image data signal processed by the analog signal processor. For example, the image signal processor may reduce noise from input image data and perform image signal processing such as gamma correction, color filter array interpolation, color matrix, color correction, color enhancement, white balance adjustment, luminance smoothing, color shading, etc., for improving a picture quality and providing special effects. The image signal processor may generate an image file by compressing the input image data or restore the image data from the image file. A compression format of an image may be reversible or irreversible. As an example of an appropriate format, it is possible to convert a still image into a Joint Photographic Experts Group (JPEG) format, a JPEG 2000 format, and so on. When a video is recorded, a video file may be generated by compressing a plurality of frames according to a Moving Picture Experts Group (MPEG) standard. The image file may be generated, for example, according to an exchangeable image file format (Exif) standard.

The image signal processor may generate a video file from an imaging signal generated by the image sensor 116. The imaging signal may be a signal which is generated by the image sensor 116 and processed by the analog signal processor. The image signal processor may generate frames to be included in a video file from the imaging signal, compress the frames by encoding the frames according to a standard such as MPEG4, H.264/Advanced Video Coding (AVC), Windows Media Video (WMV), etc., and then generate a video file using the compressed frames. The video file may be generated in various formats such as mpg, mp4, 3gpp, avi, asf, mov, and so on. The image signal processor may output a generated first image to the controller 120.

The image signal processor may perform unclearness processing, coloring processing, blurring processing, edge enhancement processing, image analysis processing, image recognition processing, image effect processing, etc. on the input image data. Image recognition processing may include face recognition, scene recognition processing, etc. The image signal processor may perform image signal processing for displaying the image data on a display. For example, the image signal processor may perform brightness level adjustment, color correction, contrast adjustment, contour emphasis adjustment, screen split processing, character image generation, image synthesis processing, etc.

The focus detector 118 may acquire information regarding the first focus by using a phase detection auto focus (PAF) reliability value. Accordingly, the controller 120 may set an addition range of the phase difference pixels based on the information regarding the first focus, and the focus detector 118 may detect a second focus based on the added output signals of the phase difference pixels.

The controller 120 may change the addition range of the phase difference pixels when the PAF reliability value is outside a previously determined PAF reliability range.

The PAF reliability value may be at least one of a phase detection auto focus value, a phase difference auto focus value, a phase detection auto focus signal level value, a sum of absolute differences (SAD) value, a sum of squared differences (SSD) value, a repeat pattern value, an AF reliability value, and a defocus amount value.

The controller 120 may determine a disparity from the SAD value, and when the disparity is greater or less than 0, may set the addition range of the phase difference pixels based on the disparity.

The controller 120 may determine a curvature of a correlation calculation graph based on the SAD value, and when the curvature of the correlation calculation graph is less than a first curvature, the controller 120 may increase the addition range of the phase difference pixels, and when the curvature of the correlation calculation graph is greater than a second curvature, the controller 120 may reduce the addition range of the phase difference pixels.

The controller 120 may determine a smallest value of the correlation calculation graph based on the SAD value, and when the smallest value of the correlation calculation graph is less than a first smallest value, the controller 120 may reduce the addition range of the phase difference pixels, and when the smallest value of the correlation calculation graph is greater than a second smallest value, the controller 120 may increase the addition range of the phase difference pixels.

The controller 120 may determine an information analysis value on an image of the subject, and when the information analysis value on the image of the subject is outside a previously determined analysis value range, the controller 120 may may change the addition range of the phase difference pixels.

The information analysis value on the image of the subject may include at least one of a face detection value of the subject, an operation detection value of the subject, a ratio of the subject that occupies in a screen, an optical character recognition (OCR) analysis value of the subject, and an edge detection value of the subject.

The controller 120 may increase the addition range of the phase difference pixels when the operation detection value of the subject is smaller than a first detection value, may reduce the addition range of the phase difference pixels when the operation detection value of the subject is smaller than a second detection value.

The information analysis value on the image of the subject may include at least one of illuminance of an image, an exposure time of the image, contrast of the image, and an amount of defocus of the image.

The controller 120 may change a region of interest (ROI) with respect to an image based on information regarding a detected focus and information regarding the image of the subject. When the number of pixels saturated in the ROI is greater than a previously determined number of pixels, the controller 120 may exclude the saturated pixels from the addition range of the phase difference pixels. For example, the controller 120 may not include in the addition range a pixel that excessively receives light and is saturated, thereby corresponding to a highest signal value.

The controller 120 may change the addition range of the phase difference pixels by adding weights according to colors of pixels.

In this regard, an addition range of the phase difference pixels included in an image that is output by an image output unit and an addition range of the phase difference pixels included in an image used by the control 120 to detect the second focus.

Figure 2:
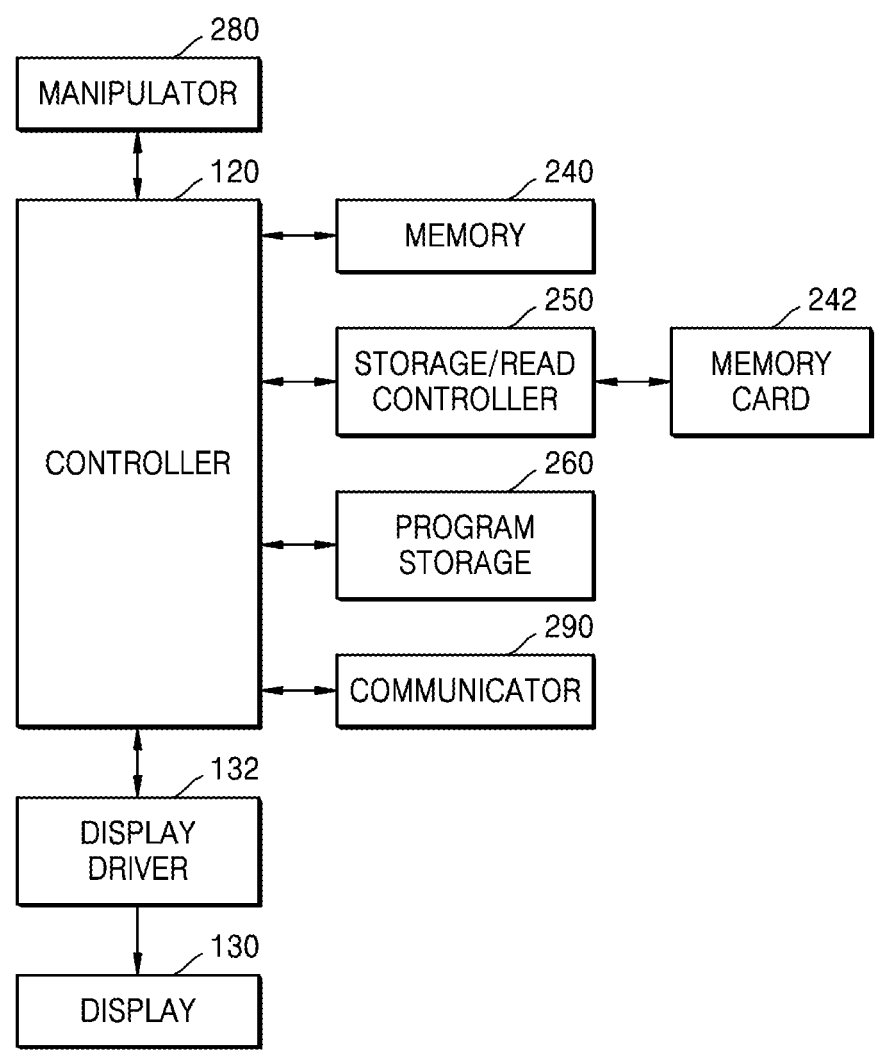
FIG. 2 is a functional block diagram illustrating an example structure of a photographing apparatus according to an example embodiment.

FIG. 2 is a functional block diagram illustrating an example structure of the photographing apparatus 100 according to an embodiment.

Referring to FIG. 2, the photographing apparatus 100 may include a controller 120, a memory 240, a storage/read controller 250, a memory card 242, a program storage 260, a display 130, a display driver 132, a manipulator (e.g., including input circuitry) 280, and a communicator (e.g., including communication circuitry) 290.

Referring to FIG. 2, the storage/read controller 250 may store image data output from the image processor 119 in the memory card 242. In this regard, the storage/read controller 250 may store the image data automatically or according to a signal from a user. The storage/read controller 250 may read data about an image from an image file stored in the memory card 242 and input the read data to the display driver 132 through memory 240 or another route to allow an image to be displayed on the display 130.

The memory card 242 may be detachable or may be permanently installed in the photographing apparatus 100. For example, the memory card 242 may be a flash memory card such as a secure digital (SD) card and so on.

Meanwhile, an image signal processed by the image processor 119 may be input to the controller 120 either through or not through the memory 240. The memory 240 may operate as a main memory of the photographing apparatus 100 and may temporarily store information necessary for an operation of the photographing apparatus 100. The program storage 260 may store programs, such as an operating system running the photographing apparatus 100, an application system, etc.

The photographing apparatus 100 may include the display 130 to display an operation state of the photographing apparatus 100 or image information captured by the photographing apparatus 100. The image processor 119 may process display image signals to display photographed image information on the display 130. For example, a first camera module and a second camera module may perform brightness level adjustment, color correction, contrast adjustment, contour emphasis adjustment, screen split processing, generation of a character image and the like, image synthesis processing, etc. on the photographed image information.

The display 130 may provide visual information to the user. The display 130 may be, for example, a liquid crystal display (LCD) panel, an organic light-emitting display panel, etc. to provide the visual information. The display 130 may be a touch screen capable of recognizing a touch input.

The display driver 132 may provide a driving signal to the display 130.

The manipulator 280 may include, for example, input circuitry to which the user may input a control signal. The manipulator 280 may include a variety of input circuitry, such as, for example, and without limitation, function buttons such as a shutter-release button for inputting a shutter-release signal for photographing a photo by exposing an image sensor to light for a determined period of time, a power button for inputting a control signal for controlling power on/off, a zoom button for widening or narrowing an angle of view according to an input, a mode selection button, buttons for adjusting other photographic setting values, and so on. The manipulator 280 may be implemented in any form, such as buttons, a keyboard, a touch pad, a touch screen, a remote controller, etc., through which the user may input the control signal.

The communicator 290 may include various communication circuitry, such as, for example, and without limitation, a network interface card (NIC), a modem, etc., and enable the photographing apparatus 100 to communicate with an external device over a network by wired or wirelessly.

The controller 120 may process an input image signal and control each element according to the processed image signal or an external input signal. The controller 120 may include one or more processors. Also, the processors may be implemented as an array of a plurality of logic gates or a combination of a general-purpose microprocessor and a memory storing a program executable by the microprocessor. It will be understood by one of ordinary skill in the art to which the present embodiment pertains that the processors may be implemented in other form of hardware.

The controller 120 may execute a stored program or include a separate module to generate control signals for controlling auto-focusing, a zoom change, a focus change, automatic exposure correction, etc., may provide the generated control signals to the aperture driver 115, the lens diver 112, the image sensor 116, the addition processor 117, the focus detector 118, and the image processor 119, may collectively control operations of elements such as a shutter, a strobo, etc., provided in the photographing apparatus 100.

The controller 120 may be connected to an external monitor and may perform image signal processing on an image signal input from the image processor 119 to allow image signal to be displayed on the external monitor, and may transmit image data processed in the image signal processing to allow a corresponding image to be displayed on the external monitor.

FIGS. 1 and 2 are block diagrams illustrating examples of the photographing apparatus 100 according to an example embodiment. Each element of the block diagrams of FIGS. 1 and 2, may be combined with other elements, added to other elements, or omitted from the photographing apparatus 100 according to a specification of the photographing apparatus 100. Thus, if necessary, two or more elements may be incorporated into one element, or one element may be split into two or more elements. Functions performed by each block are for explaining the embodiments and detailed operations thereof do not limit the scope of the present disclosure.

Figure 3:
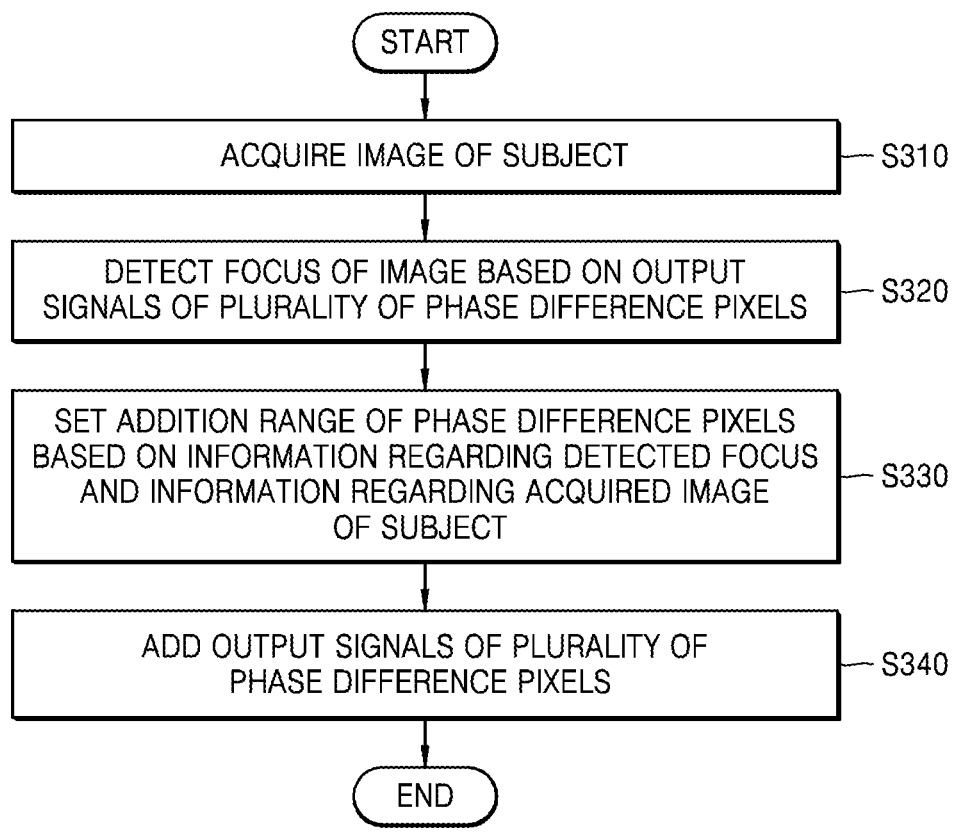
FIG. 3 is a flowchart illustrating an example method of automatically detecting a focus by using a phase difference detection scheme according to an example embodiment.

FIG. 3 is a flowchart illustrating an example method of automatically detecting a focus by using a phase difference detection scheme according to an example embodiment.

In operation S310, the photographing apparatus 100 may acquire an image of a subject. The photographing apparatus 100 may include an image sensor. In this regard, resolution of the image sensor may be determined by a number of pixels included in the image sensor. The more the number of pixels included in the image sensor, the higher the resolution of the image sensor.

In operation S320, the photographing apparatus 100 may detect a focus of the image based on output signals of a plurality of phase difference pixels.

The photographing apparatus 100 may receive a pair of image signals from a focus detection phase difference pixel. The photographing apparatus 100 may compute an amount of shift (phase difference) between the pair of image signals and may determine an amount of defocus through a previous determined conversion factor. According to an embodiment, the photographing apparatus 100 may determine reliability of detection of the focus from the amount of defocus.

In operation S330, the photographing apparatus 100 may set an addition range of the phase difference pixels based on information regarding the detected focus and information regarding the acquired image of the subject.

The photographing apparatus 100 may firstly determine whether to add the phase difference pixels through the information regarding the detected focus and the information regarding the acquired image of the subject. For example, when disparity is detected as 0, the photographing apparatus 100 may not add the phase difference pixels.

The photographing apparatus 100 may determine the information regarding the detected focus as a PAF reliability value. The PAF reliability value may be at least one of a phase detection auto focus value, a phase difference auto focus value, a phase detection auto focus signal level value, a SAD value, a SSD value, a repeat pattern value, an AF reliability value, and a defocus amount value.

The photographing apparatus 100 may detect the information regarding the acquired image of the subject through at least one of detection of a face of the subject, OCR information, detection of an edge, detection of an operation vector, contrast information, information regarding whether an ROI is saturated, size of the subject, and depth information.

In operation S340, the photographing apparatus 100 may add the output signals of the plurality of phase difference pixels.

The photographing apparatus 100 may add the output signals of the phase difference pixels based on whether to add the phase difference pixels with respect to a determined focus and the addition range.

The photographing apparatus 100 may detect the focus based on the added phase difference pixels. The photographing apparatus 100 may control a focus position according to the information regarding the detected focus. The photographing apparatus 100 may also control a focus of a lens with respect to the subject. The photographing apparatus 100 may control the focus of the lens and move the focus to a position determined based on the added phase difference pixels.

Figure 4A:
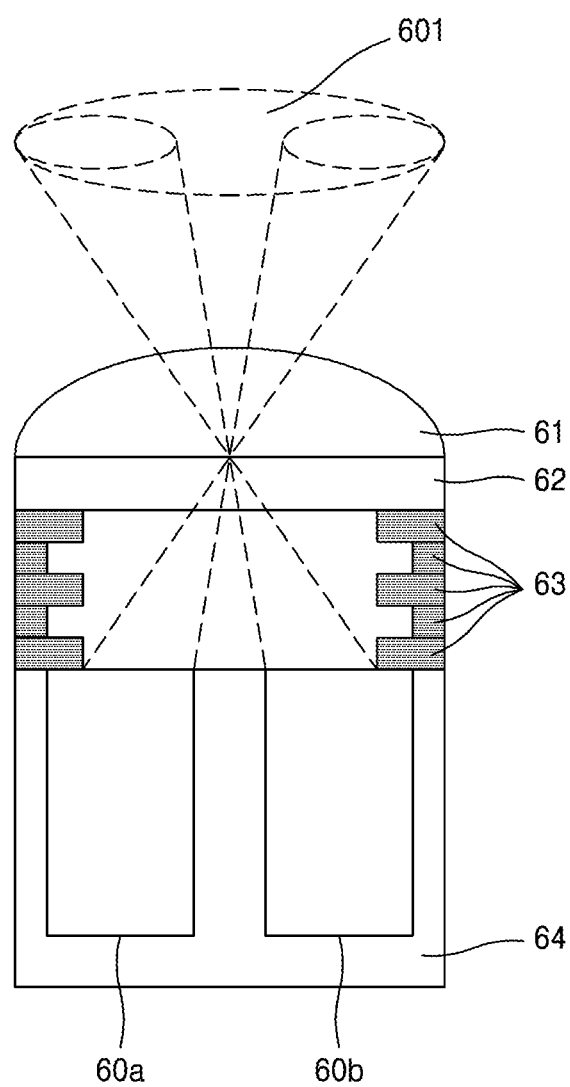
FIGS. 4A and 4B are plan views illustrating an example phase difference detection pixel according to an example embodiment.
Figure 4B:
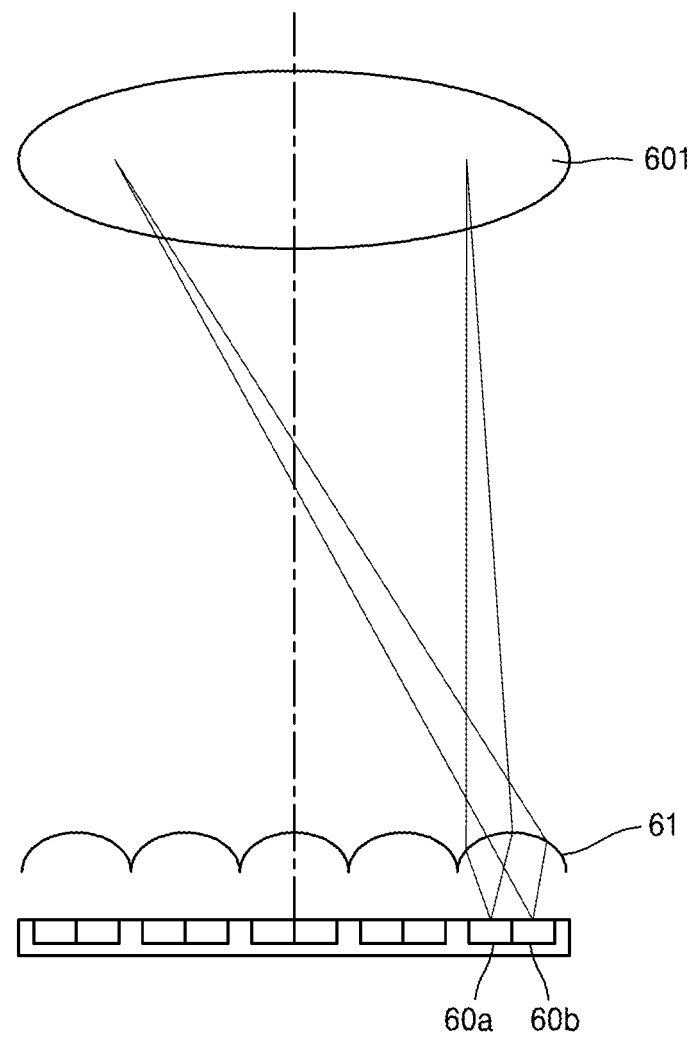

FIGS. 4A and 4B are plan views illustrating an example phase difference detection pixel according to an example embodiment.

Referring to FIG. 4A, a phase difference detection pixel included in an image sensor may include a pair of photodiodes 60*a* and 60*b*, a micro lens 61, a color filter 62, a metal layer 63, and a substrate 64.

The photodiodes 60*a* and 60*b* may be devices converting a light signal into an electrical signal by using a photoelectric effect. The photoelectric effect may refer, for example, to a phenomenon wherein an object receives light, and electrons in the object absorb light energy and emit photoelectrons. The photodiodes 60*a* and 60*b* may include two photodiodes 60*a* and 60*b*.

The photodiodes 60*a* and 60*b* may be included in the silicon substrate 64.

The metal layer 63 may be formed in a circuit region between the two photodiodes 60*a* and 60*b* and the color filter 62. The metal layer 63 may be one of metal wiring, multilayer wiring, and wiring layers.

A lens buffer or a planarization layer may be formed in the micro lens 61 and the color filter 62.

The micro lens 61 may efficiently collect light in the photoelectric conversion devices 60*a* and 60*b*. Thus, an optical axis of the micro lens 61 may be disposed to fit in a boundary of the photoelectric conversion devices 60*a* and 60*b*.

The color filter 62 may include a color filter of red (R), green (G), and blue (B) in order to acquire a video image.

R may refer to a red pixel. G may refer to a green pixel. B may refer to a blue pixel. The micro lens 61 may be formed in an upper portion of each of the pixels R, G, and B.

FIG. 4B is a diagram illustrating an optical principle of an image sensor including a phase difference detection pixel.

Referring to FIG. 4B, an exit pupil 601 may refer to an image in an image space of a valid aperture of an optics. The exit pupil 601 may be an incident pupil. A relationship between the exit pupil 601 and the incident pupil is the same as an imaging relationship between an object and an image of the object. Each of the photodiodes 60*a* and 60*b* may be configured to receive a pair of light fluxes that pass through another region of the exit pupil 601. For example, the photodiode 60*a* may receive a light flux that passes through a right area of the exit pupil 601. The photodiode 60*b* may receive a light flux that passes through a left area of the exit pupil 601.

Figure 5A:
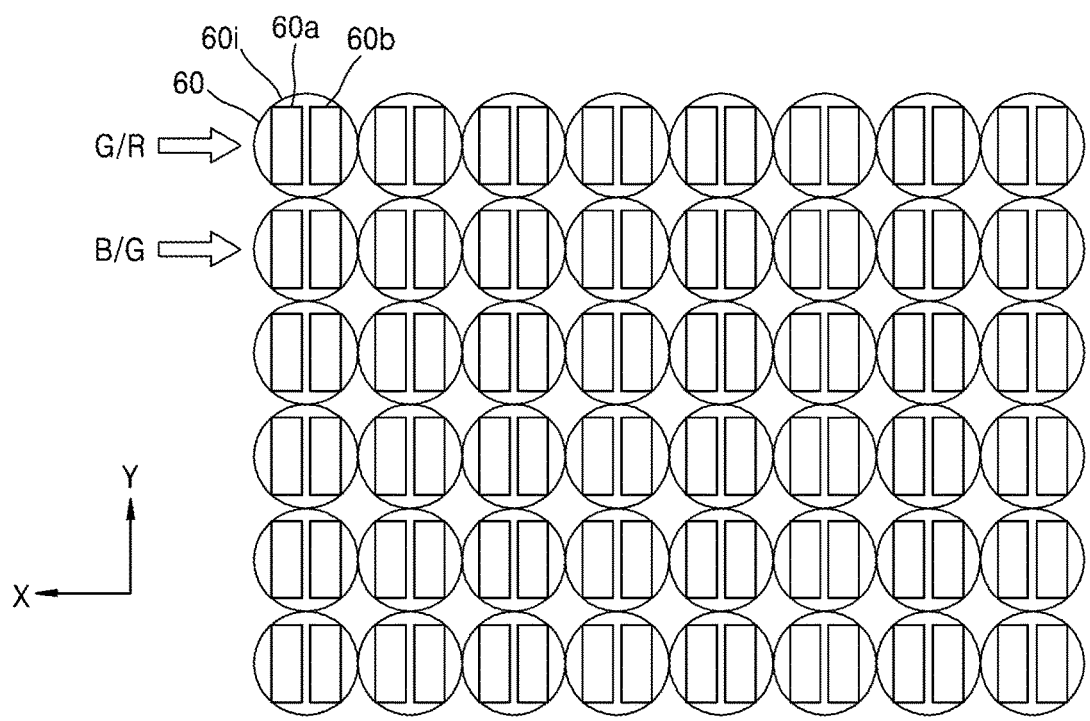
FIGS. 5A and 5B are diagrams illustrating example pixel arrays of an image sensor including a phase difference detection pixel and an image detection pixel according to an example embodiment.
Figure 5B:
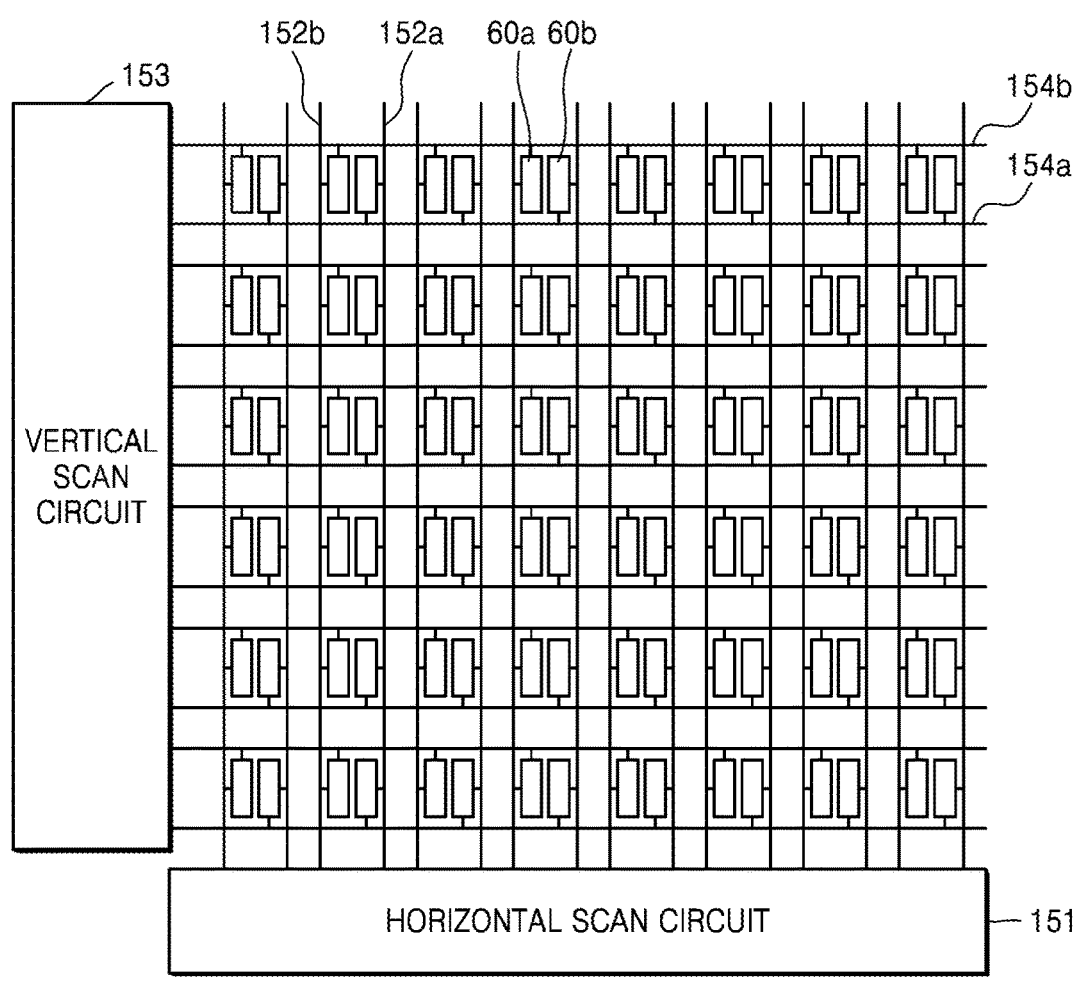

FIGS. 5A and 5B are diagrams illustrating example pixel arrays of an image sensor including a phase difference detection pixel and an image detection pixel according to an example embodiment.

According to an example embodiment, a pixel array of an image sensor may present a range of 6 rows in a vertical direction (Y direction) and 8 columns in a horizontal direction (X direction) of a 2D C-MOS area sensor observed from a lens unit 100 but is not limited thereto.

A Bayer pattern color filter may be disposed in the image sensor 116. Green (G) and red (R) color filters may be sequentially disposed from the left in odd row pixels. Blue (B) and green (G) color filters may be sequentially disposed from the left in even row pixels. For example, a circuit 60*i* of a pixel 60 may refer, for example, to a micro lens, and a plurality of rectangles 60*a* and 60*b* disposed in the micro lens may be photodiodes.

The pixel array may be included in the photographing apparatus 100. The photographing apparatus 100 may be used in a laptop computer, a cellular phone or a mobile phone, a smart phone, a tablet PC, a digital camera, a camcorder, a mobile Internet device (MID), a wearable computer, a Internet of thins (IoT) device, an Internet of everything (IoE) device, etc.

Each of the photodiodes included in the pixel array may be an example of a photoelectric conversion device and may be replaced with a phototransistor, a photogate, or a pinned photodiode.

Each of a plurality of photodiodes included in each pixel may independently capture light or an image. In the image sensor 116 according to an embodiment, photoelectric converters of all pixels may be split into two parts in an X direction, and photoelectric conversion signals of the photodiodes 60*a* and 60*b* and a sum of the photoelectric conversion signals may be independently read. A photoelectric conversion signal of one photoelectric converter may be subtracted from the sum of the photoelectric conversion signals, and thus a signal corresponding to a photoelectric conversion signal of another photoelectric converter may be obtained. The photoelectric conversion signals of the photodiodes 60*a* and 60*b* may be used as phase difference AF data or may be used to generate a parallax image constituting a 3-dimensional (3D) image. The sum of the photoelectric conversion signals may be used as general photographing image data.

A pixel output signal when a phase difference AF is performed, according to an embodiment, is described below. According to an embodiment, the micro lens 60*i* and the split photodiodes 60*a* and 60*b* of FIG. 5A may pupil-split an exit light flux of a photographing optics. With respect to a plurality of pixels within a certain range in the same pixel row, pixels in combination of an output of the photodiode 60*a* indicate A images for AF, and pixels in combination of an output of the photodiode 60*b* indicate B images for AF. The output of the photodiodes 60A and 60B may include pseudo brightness (Y) signals obtained by adding green, red, and blue outputs according to a unit arrangement of a color filter. A relative amount of shift of the A and B images for AF may be detected by performing a correlation calculation, thereby detecting an amount of focus shift (an amount of defocus) of a certain region.

FIG. 5B is a diagram illustrating an example of a read circuit of the image sensor 116 according to an example embodiment. The read circuit may include a horizontal scan circuit 151 and a vertical scan circuit 153. Vertical scan lines 152a and 152b and horizontal scan lines 154a and 154b may be disposed in a boundary of each pixel. A signal of each of the photodiodes 60a and 60b may be read to the outside through the vertical and horizontal scan lines 152a and 152b and 154a and 154b.

According to an embodiment, reading of an output signal of a pixel may further include two read modes of an entire pixel mode and a thinning read mode. The full pixel mode is a mode for imaging a high definition still image. In this case, signals of entire pixels may be read.

The thinning read mode is a mode for only recording a moving image or displaying a preview image. In this case, since the number of pixels necessary for reading is less than entire pixels, only pixels included in a pixel group remaining after thinning pixel groups at a certain ratio in X and Y directions may be read. When it is necessary to read a pixel at a high speed, the thinning read mode may also be used. When a pixel is thinned in the X direction, signals may be added to improve an S/N ratio. When the pixel is thinned in the Y direction, an output of a signal of a thinned row may be disregarded. Phase difference AF and contrast AF may detect a focus based on a signal read in the thinning read mode.

Figure 6:
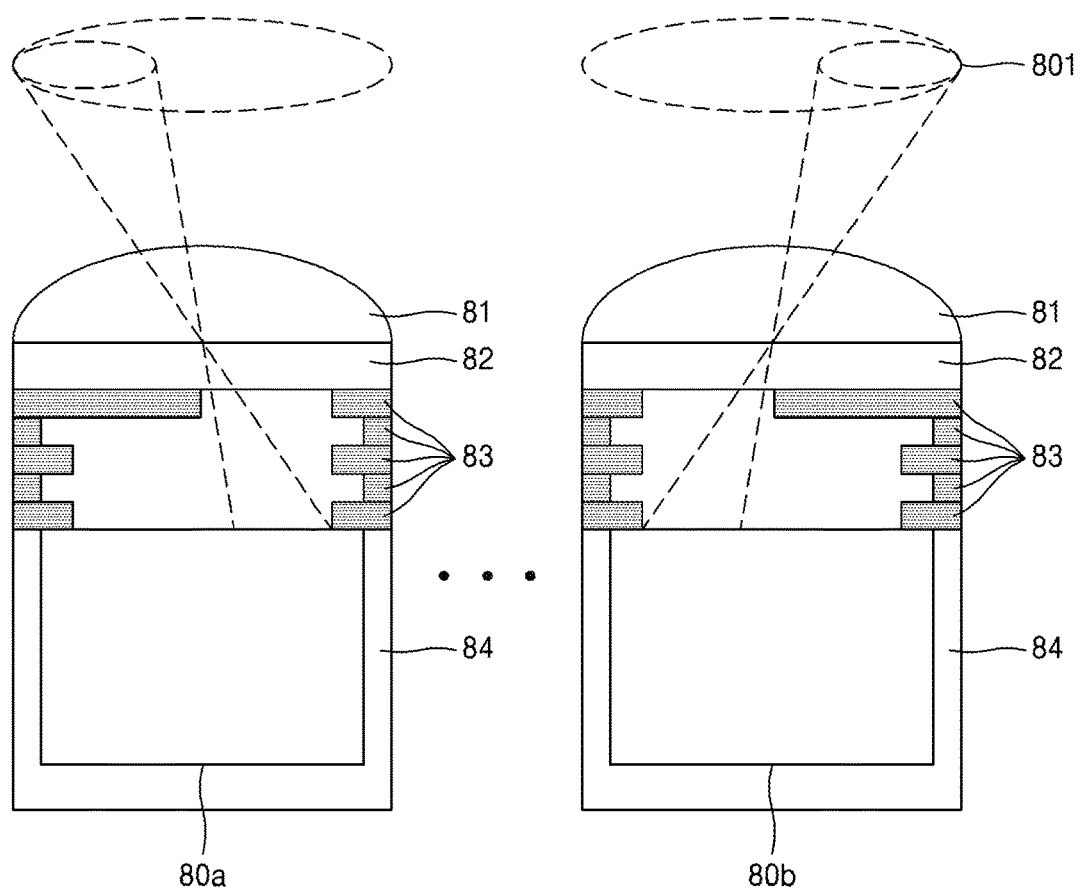
FIG. 6 is a diagram illustrating an example phase difference pixel detecting a phase difference signal by using two pixels according to an example embodiment.

FIG. 6 is a diagram illustrating example phase difference pixels detecting a phase difference signal according to an example embodiment. As illustrated in FIG. 6, only two pixels are used to detect a phase difference signal according to an example embodiment.

Each of the phase difference pixels detecting the phase difference signal may include metal, etc. to shield a part of a photodiode and may detect only light incident to a part of the photodiode that is not shielded. As shown in FIG. 6, a phase difference may be detected using a shielded pixel and a non-shielded pixel, i.e., two pixels.

A micro lens 81 may efficiently collect light in each of photodiodes 80a and 80b.

A metal layer 83 may be included in each of the phase difference pixels and may be different according to each of the pixels. For example, an opening of the metal layer 83 may be shifted to the right in a phase difference pixel including the photodiode 80a, and thus, the phase difference pixel may be have a sensitivity peak in a left direction. The opening of the metal layer 83 may be shifted to the left in a phase difference pixel including the photodiode 80b, and thus, the phase difference pixel may be have a sensitivity peak in a right direction.

Figure 7:
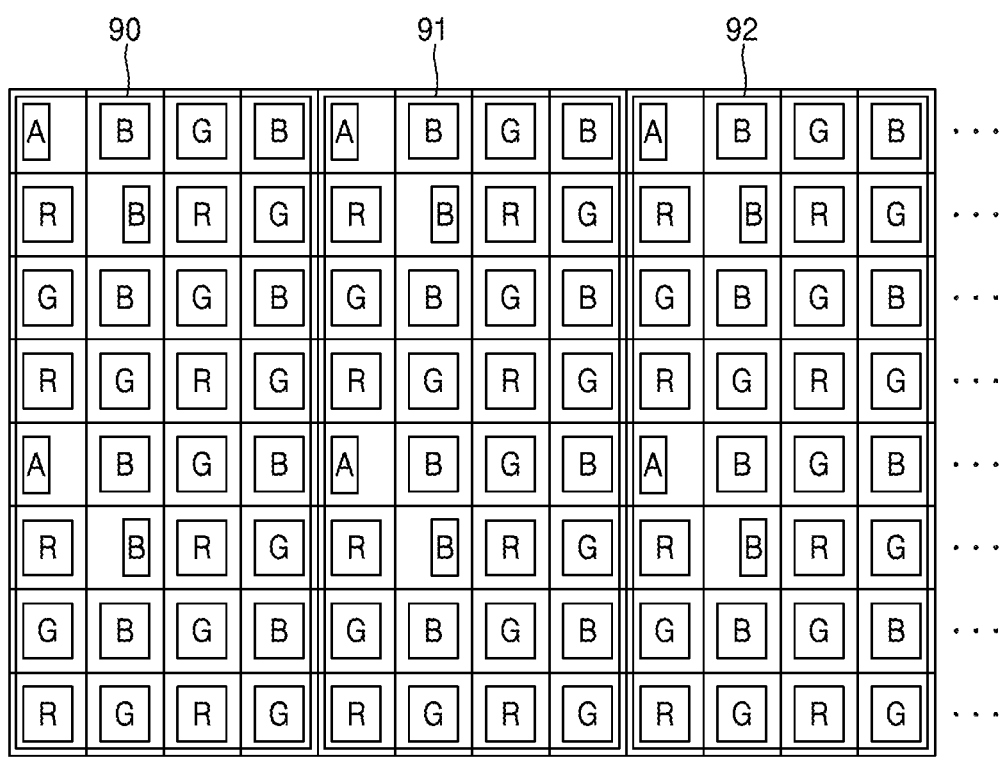
FIG. 7 is a plan view illustrating an example partial structure of an image sensor according to an example embodiment.

FIG. 7 is a plan view illustrating an example of a partial structure of an image sensor according to an example embodiment.

According to an example embodiment, a phase difference pixel A may have a sensitivity peak in a right direction, and a phase difference pixel B may have a sensitivity peak in a left direction. The image sensor may include a pixel array in which a focus detection pixels A and B are discretely disposed. The image sensor may include a Bayer arrangement in which R, G, and B color filters are alternately disposed.

Referring to FIG. 7, the focus detection pixels A and B occupy a partial region of one pixel, whereas R, G, and B color pixels occupy an entire region of the pixel. Thus, focus detection pixels and color pixels may be distinguished in FIG. 7. For example, as shown in FIG. 7, the B color pixel displayed on a first row of a first pixel block 90 and the focus detection pixel B displayed on a second row may be distinguished.

According to an embodiment, the photographing apparatus 100 may detect a focus and then add an output signal from a photodiode corresponding to the phase difference pixel A, thereby acquiring a focus detection signal from one pixel. The photographing apparatus 100 may continuously acquire the focus detection signal in a transverse direction, thereby generating an A image signal.

The photographing apparatus 100 may add an output signal from a photodiode corresponding to the phase difference pixel B, thereby acquiring a focus detection signal from one pixel. The photographing apparatus 100 may continuously acquire the focus detection signal in a transverse direction, thereby generating a B image signal.

The photographing apparatus 100 may generate a pair of phase difference detection signals by the A image signal and the B image signal.

According to an embodiment, as illustrated in FIG. 7, the photographing apparatus 100 may detect a focus by adding the phase difference pixels A and B included in each of pixel blocks 90, 91, and 92.

The photographing apparatus 100 may detect the focus by using a phase detection auto focus (PAF) reliability value by using the pair of phase difference detection signals obtained from the phase difference signals.

The PAF reliability value may be at least one of a phase detection auto focus value, a phase difference auto focus value, a phase detection auto focus signal level value, a SAD value, a SSD value, a repeat pattern value, an AF reliability value, and a defocus amount value.

Figure 8:
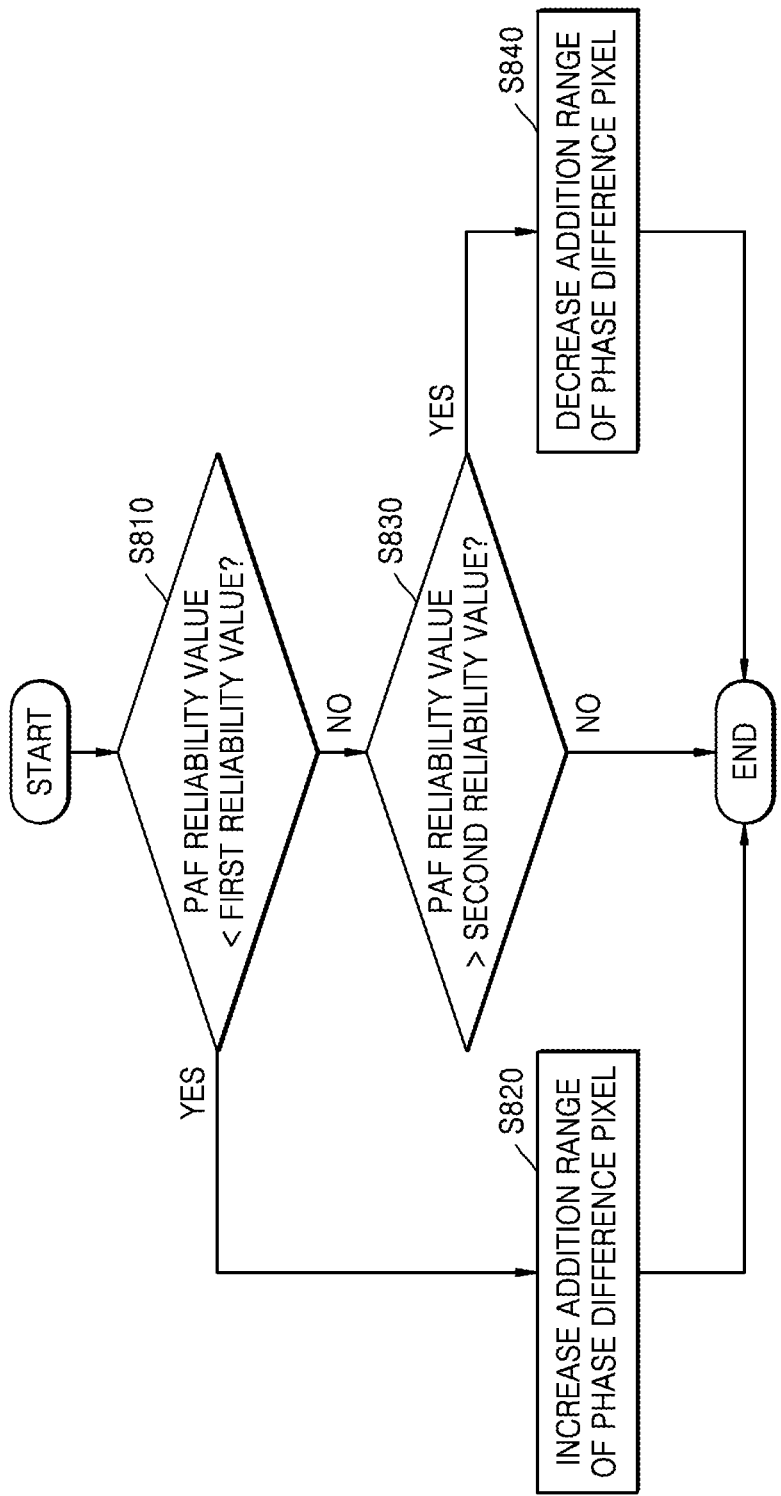
FIG. 8 is a flowchart illustrating an example method of controlling an addition range of a phase difference pixel by using a phase detection auto focus (PAF) reliability value performed by a photographing device according to an example embodiment.

FIG. 8 is a flowchart illustrating an example method of controlling an addition range of a phase difference pixel by using a PAF reliability value performed by the photographing device 100 according to an example embodiment.

In operation S810, the photographing apparatus 100 may compare the PAF reliability value and a first reliability value. In this regard, the first reliability value may be a reference value determining whether a focus is detected. For example, when it is determined that the PAF reliability value is smaller than the first reliability value, the photographing apparatus 100 may determine that the focus is not clearly detected. When it is determined that the PAF reliability value is smaller than the first reliability value, the photographing apparatus 100 may move to operation S820. When it is determined that the PAF reliability value is greater than the first reliability value, the photographing apparatus 100 may move to operation S830.

In operation S820, the photographing apparatus 100 may control the addition range of the phase difference pixel to increase. In this regard, the addition range of the phase difference pixel may refer, for example, to a range of adding a pixel outputting an image signal in order to control a focus detection region. When it is determined that the PAF reliability value is smaller than the first reliability value, the photographing apparatus 100 may control the addition range of the phase difference pixel to allow the PAF reliability value to be greater than the first reliability value. For example, when it is determined that the PAF reliability value is smaller than the first reliability value, the photographing apparatus 100 may increase the number of added pixels.

In operation S830, the photographing apparatus 100 may compare the PAF reliability value and a second reliability value. In this regard, the second reliability value may be the reference value determining whether the focus is detected. For example, when it is determined that the PAF reliability value is greater than the second reliability value, the photographing apparatus 100 may determine that the focus is not clearly detected. When it is determined that the PAF reliability value is greater than the second reliability value, the photographing apparatus 100 may move to operation S840.

In operation S840, the photographing apparatus 100 may decrease the addition range of the phase difference pixel. In this regard, the addition range of the phase difference pixel may refer, for example, to the range of adding the pixel outputting the image signal in order to control the focus detection region. When it is determined that the PAF reliability value is greater than the second reliability value, the photographing apparatus 100 may control the addition range of the phase difference pixel. For example, when it is determined that the PAF reliability value is greater than the second reliability value, the photographing apparatus 100 may reduce the number of added pixels. That is, added pixel output signals may be reduced, thereby controlling a signal of the focus detection region.

Figure 9A:
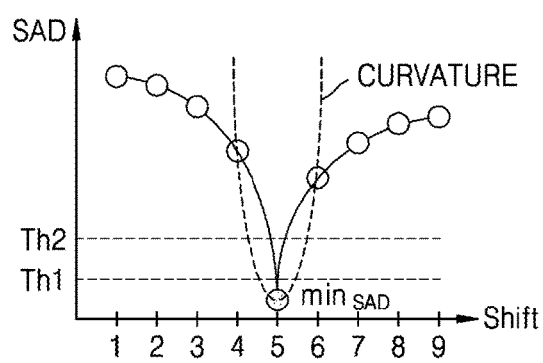
FIGS. 9A and 9B are graphs illustrating examples of determining whether to detect a focus through a PAF reliability value performed by a photographing apparatus according to an example embodiment.
Figure 9B:
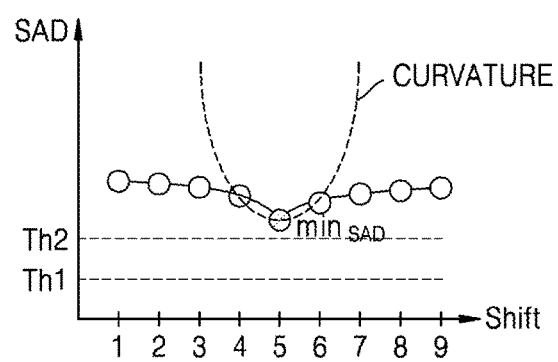

FIGS. 9A and 9B are graphs illustrating examples of determining whether to detect a focus through a PAF reliability value performed by the photographing apparatus 100 according to an example embodiment.

The photographing apparatus 100 may determine a disparity from an SAD value, and when the disparity is smaller than 0, and may set an addition range of a phase difference pixel based on the disparity.

The photographing apparatus 100 may perform correlation calculation on the basis of an output signal obtained from the phase difference pixel according to Equation 1 below.

$$SAD_k = \sum_{x=0}^{m-1} \sum_{y=0}^{n-1} |I_L(x, y) - I_R(x+k, y)|$$ [Equation 1]

where $SAD_k$ is a value output by performing the correlation calculation. The photographing apparatus 100 may determine an accuracy of focus detection with respect to an image based on $SAD_k$. $I_L$ may be a value of a signal output through the photodiode 60a of FIG. 4 and the photodiode 80a of FIG. 6. $I_R$ may be a value of a signal output through the photodiode 60b of FIG. 4 and the photodiode 80b of FIG. 6. m may be the number of rows of an ROI set to detect a focus. n may be the number of columns of an ROI set to detect a focus. k may be a pixel shift value.

The photographing apparatus 100 may determine an amount of pixel shift having a smallest SAD value based on a correlation calculation value output by performing correlation calculation, i.e., an SAD value. In this regard, the amount of pixel shift having the smallest SAD value may refer, for example, to a disparity.

When the photographing apparatus 100 performs an initial focus detection process, the photographing apparatus 100 may determine that an accurate focus is determined when determining that the disparity is 0, whereas the photographing apparatus 100 may control an addition range of a phase difference pixel when determining that the disparity is not 0.

The photographing apparatus 100 may extract correlation calculation graphs based on the SAD value as shown in FIGS. 9A and 9B.

The photographing apparatus 100 may determine curvatures of the correlation calculation graphs based on the SAD value. When the curvatures of the correlation calculation graphs are smaller than a first curvature, the photographing apparatus 100 may increase the addition range of the phase difference pixel. When the curvatures of the correlation calculation graphs are greater than a second curvature, the photographing apparatus 100 may reduce the addition range of the phase difference pixel. In this regard, the first curvature and the second curvature may be reference values for photographing apparatus 100 to determine whether a focus of an image is accurately detected.

For example, when a contrast value of an input image is high when correlation calculation is performed, as shown in FIG. 9A, a curve of a correlation calculation curvature sharpens, and when the contrast value of the input image is low, as shown in FIG. 9B, a curve of a correlation calculation curvature is gentle. When the curvatures are smaller than the first curvature or greater than the second curvature, the photographing apparatus 100 may control the addition range of the phase difference pixel. In this regard, the input image may refer, for example, to an output signal detected from the phase difference pixel in order to perform correlation calculation.

Referring to FIGS. 9A and 9B, the photographing apparatus 100 may determine a smallest value $min_{SAD}$ of the correlation calculation graphs.

The smallest value $min_{SAD}$ of the correlation calculation graphs may vary according to noise of the input image. For example, when the input image has small noise, as shown in FIG. 9A, since the smallest value $min_{SAD}$ of the correlation calculation graph is lower than a first smallest value Th1, the photographing apparatus 100 may reduce the addition range of the phase difference pixel. When the input image has much noise, as shown in FIG. 9B, since the smallest value $min_{SAD}$ of the correlation calculation graph is higher than a second smallest value Th2, the photographing apparatus 100 may increase the addition range of the phase difference pixel.

The photographing apparatus 100 may reduce the addition range of the phase difference pixel when the smallest value $min_{SAD}$ of the correlation calculation graph is lower than the first smallest value Th1, and may increase the addition range of the phase difference pixel when the smallest value $min_{SAD}$ of the correlation calculation graph is higher than the second smallest value Th2.

Figure 10:
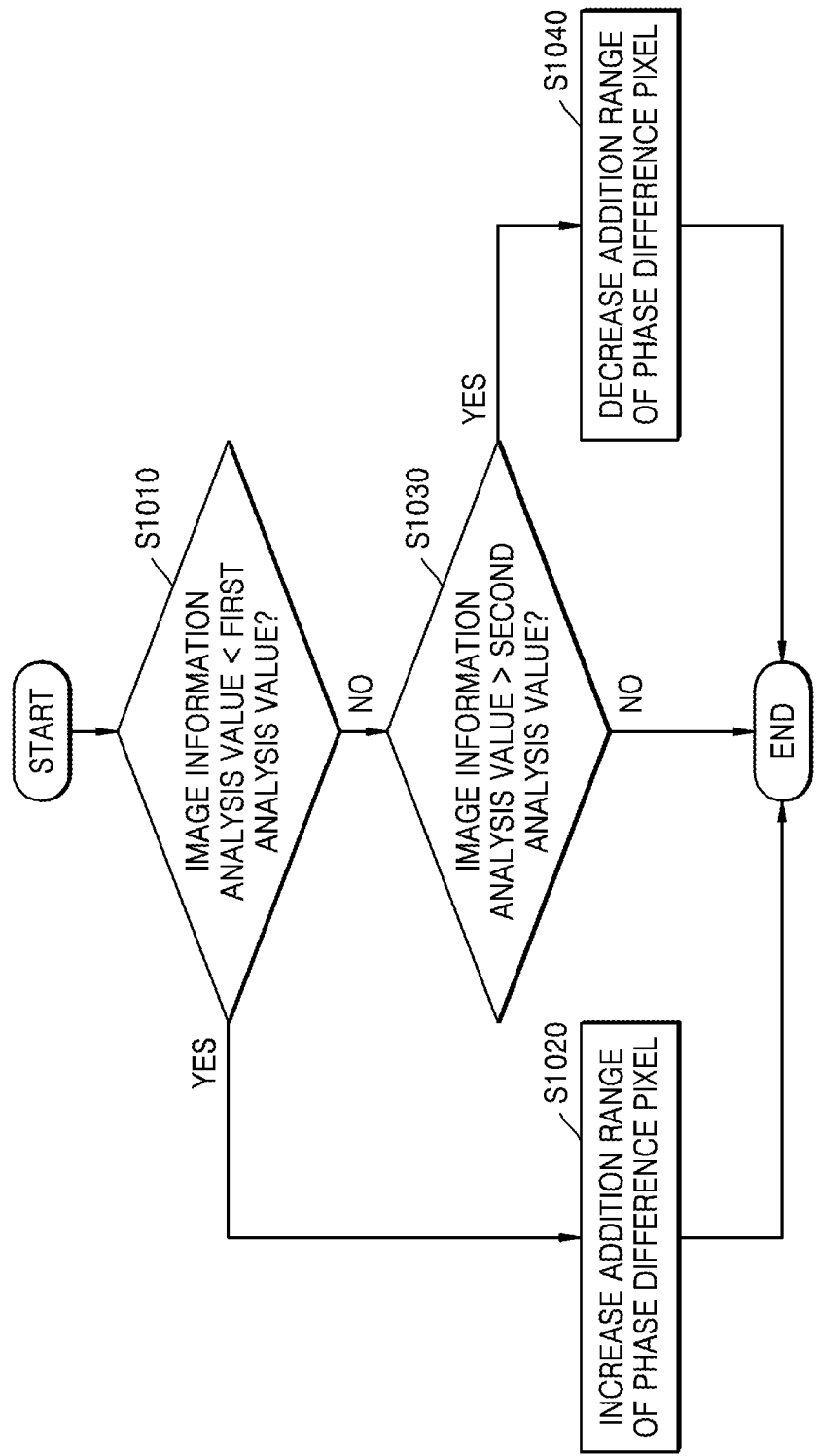
FIG. 10 is a flowchart illustrating an example method of controlling an addition range of a phase difference pixel based on an image information analysis value performed by a photographing device according to an example embodiment.

FIG. 10 is a flowchart illustrating an example method of controlling an addition range of a phase difference pixel based on an image information analysis value performed by the photographing apparatus 100 according to an example embodiment.

In operation S1010, the photographing apparatus 100 may compare the image information analysis value and a first analysis value. In this regard, the first analysis value may be a reference value determining whether a focus is detected in accordance with a previously determined reliability. More specifically, the first analysis value may be the reference value determining whether to easily detect the focus according to image information acquired by a current photographing apparatus.

For example, when it is determined that the image information analysis value is smaller than the first analysis value, the photographing apparatus 100 may determine that the focus is not clearly detected. When it is determined that the image information analysis value is smaller than the first analysis value, the photographing apparatus 100 may move to operation S1020. When it is determined that the image information analysis value is greater than the first analysis value, the photographing apparatus 100 may move to operation S1030.

In this regard, the image information analysis value may include at least one of a face detection value of the subject, an operation detection value of the subject, a ratio of the subject that occupies in a screen, an OCR analysis value of the subject, and an edge detection value of the subject.

The image information analysis value may include at least one of illuminance of an image, an exposure time of the image, contrast of the image, and an amount of defocus of the image but is not limited thereto.

In operation S1020, the photographing apparatus 100 may control the addition range of the phase difference pixel to increase. In this regard, the addition range of the phase difference pixel may refer, for example, to a range of adding a pixel outputting an image signal in order to control a focus detection region. When it is determined that the image information analysis value is smaller than the first analysis value, the photographing apparatus 100 may control the addition range of the phase difference pixel to allow the image information analysis value to be greater than the first analysis value. For example, when it is determined that the image information analysis value is smaller than the first analysis value, the photographing apparatus 100 may increase the number of added pixels.

In operation S1030, the photographing apparatus 100 may compare the image information analysis value and a second analysis value. In this regard, the second analysis value may be the reference value determining whether the focus is detected. For example, when it is determined that the image information analysis value is greater than the second analysis value, the photographing apparatus 100 may compare the focus and a previously determined focus range and may determine that the focus is not clearly detected. When it is determined that the image information analysis value is greater than the second analysis value, the photographing apparatus 100 may move to operation S1040.

In operation S1040, the photographing apparatus 100 may control the addition range of the phase difference pixel to decrease. In this regard, the addition range of the phase difference pixel may refer, for example, to the range of adding the pixel outputting the image signal in order to control the focus detection region. When it is determined that the image information analysis value is greater than the second analysis value, the photographing apparatus 100 may control the addition range of the phase difference pixel to allow the image information analysis value to be smaller than the second analysis value. For example, when it is determined that the image information analysis value is greater than the second analysis value, the photographing apparatus 100 may reduce the number of added pixels. That is, added pixel output signals may be reduced, thereby controlling a signal of the focus detection region.

As a result, when the image information analysis value is smaller than the first analysis value or greater than the second analysis value, the photographing apparatus 100 may determine that the focus is not easily detected. The photographing apparatus 100 may control the addition range of the phase difference pixel. Accordingly, the photographing apparatus 100 may increase reliability of detection of the focus according to acquired current image information.

Figure 11:
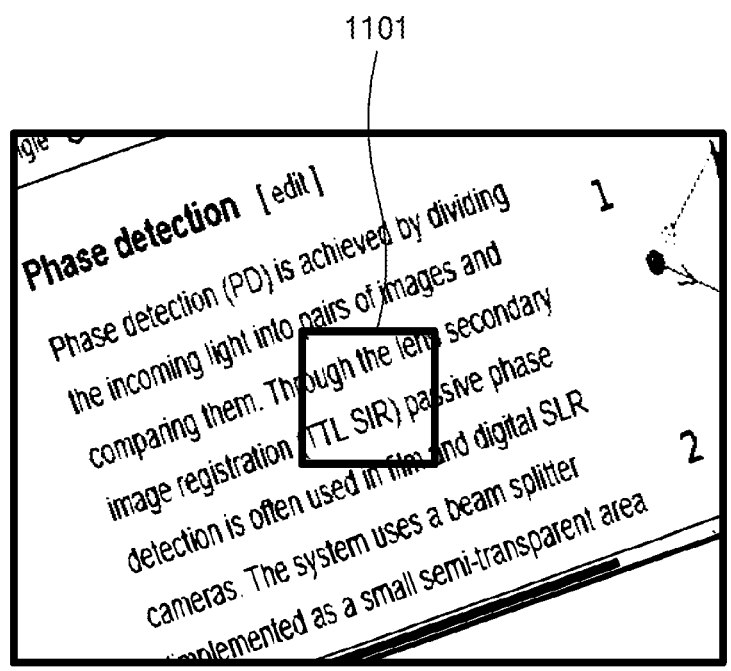
FIGS. 11 and 12 are diagrams illustrating an example of controlling an addition range of a phase difference pixel based on an image information analysis value performed by a photographing device according to an example embodiment.
Figure 12:
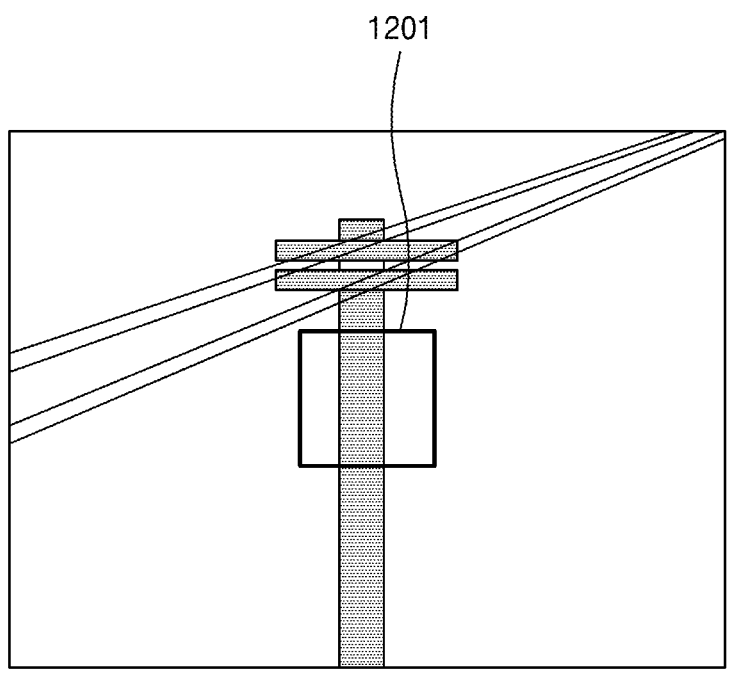

FIGS. 11 and 12 are diagrams illustrating an example of controlling an addition range of a phase difference pixel based on an image information analysis value performed by the photographing apparatus 100 according to an example embodiment.

As illustrated in FIG. 11, the photographing apparatus 100 may control the addition range of the phase difference pixel according to characters read by an OCR. The photographing apparatus 100 may perform a function of the OCR. In this regard, the OCR is an abbreviation of an optical character reader and may refer, for example, to an apparatus for reading printed characters or characters handwritten by human beings. That is, the OCR may refer, for example, to an apparatus for converting information of forms of characters, numbers, or other symbols into an electrical signal.

For example, when characters are read through the function of the OCR, the photographing apparatus 100 may reduce the number of added phase difference pixels within a range of an ROI 1101. That is, the photographing apparatus 100 may prevent blurred characters from being detected due to an increase in the addition range of the phase difference pixel.

As illustrated in FIG. 12, the photographing apparatus 100 may detect an edge of a subject. The photographing apparatus 100 may control the addition range of the phase difference pixel by a detection of the edge of the subject.

As illustrated in FIG. 12, when the number of edges is less than a number of previously determined edges, the photographing apparatus 100 may increase the addition range of the phase difference pixel.

The photographing apparatus 100 may control the addition range of the phase difference pixel according to a frequency of the subject analyzed in an image, the number of edges, etc., thereby increasing reliability of detection of a focus.

Figure 13:
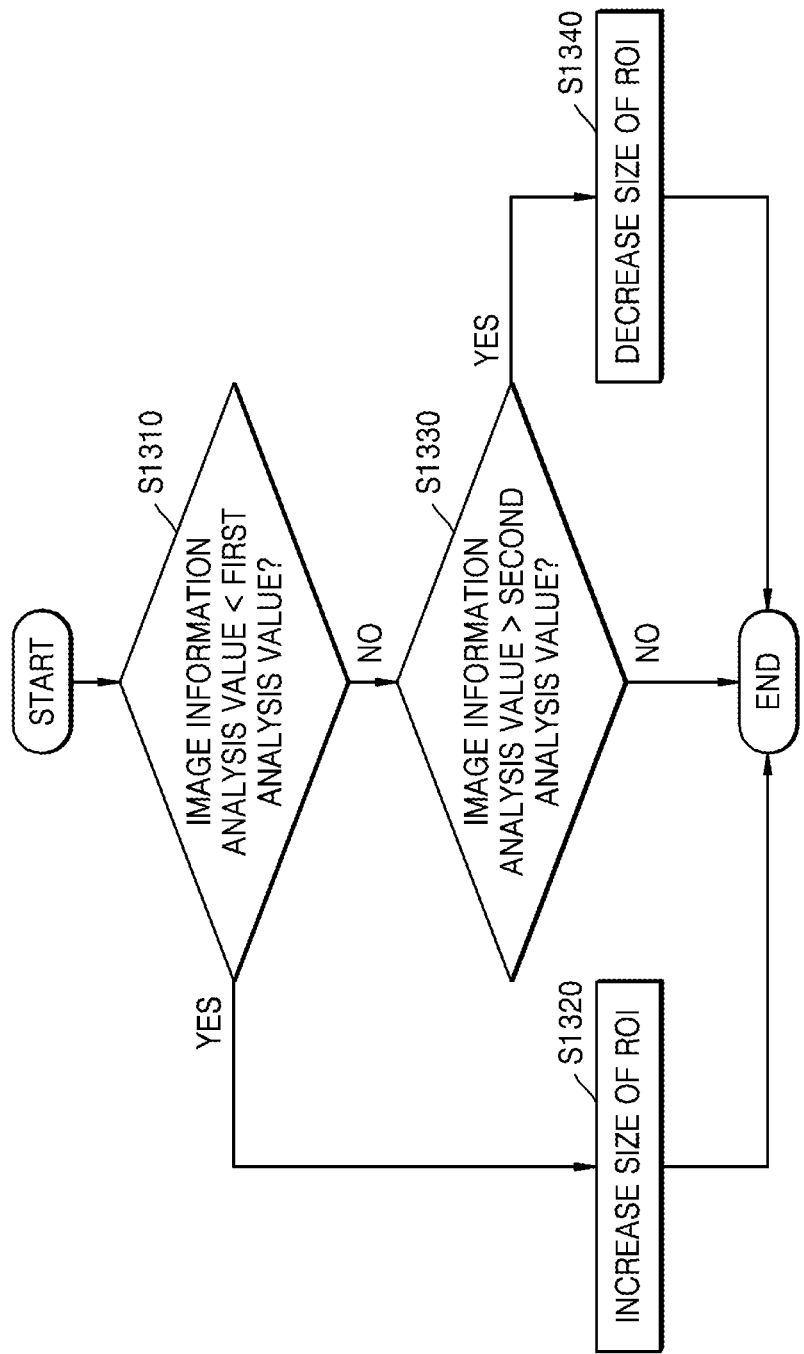
FIG. 13 is a flowchart illustrating an example method of controlling a size of a region of interest (ROI) based on an image information analysis value performed by a photographing device according to an example embodiment.

FIG. 13 is a flowchart illustrating an example method of controlling a size of a ROI based on an image information analysis value performed by the photographing apparatus 100 according to an example embodiment.

The photographing apparatus 100 may control the size and the ROI and an addition range of a phase difference pixel based on image information of a subject. The photographing apparatus 100 may control not the addition range of the phase difference pixel based on the image information of the subject but the size of the ROI.

In operation S1310, the photographing apparatus 100 may compare the image information analysis value and a first analysis value. In this regard, the first analysis value may be a reference value determining whether a focus is detected. For example, when it is determined that the image information analysis value is smaller than the first analysis value, the photographing apparatus 100 may compare the focus and a previously determined focus range and may determine that the focus is not easily detected from a current image. When it is determined that the image information analysis value is smaller than the first analysis value, the photographing apparatus 100 may move to operation S1320. When it is determined that the image information analysis value is greater than the first analysis value, the photographing apparatus 100 may move to operation S1330.

In this regard, the image information analysis value may include at least one of a face detection value of the subject, an operation detection value of the subject, a ratio of the subject that occupies in a screen, an OCR analysis value of the subject, and an edge detection value of the subject.

The image information analysis value may include at least one of illuminance of an image, an exposure time of the image, contrast of the image, and an amount of defocus of the image but is not limited thereto. According to an embodiment, the image information analysis value may include all information values that may be acquired from an image.

In operation S1320, the photographing apparatus 100 may control the size of the ROI to increase. In this regard, the size of the ROI may refer, for example, to a focus detection region range including a pixel outputting an image signal in order to control a focus detection region. When it is determined that the image information analysis value is smaller than the first analysis value, the photographing apparatus 100 may control the size of the ROI to allow the image information analysis value to be greater than the first analysis value. For example, when it is determined that the image information analysis value is smaller than the first analysis value, the photographing apparatus 100 may increase the size of the ROI.

In operation S1330, the photographing apparatus 100 may compare the image information analysis value and a second analysis value. In this regard, the second analysis value may be the reference value determining whether the focus is detected. For example, when it is determined that the image information analysis value is greater than the second analysis value, the photographing apparatus 100 may compare the focus and the previously determined focus range and may determine that the focus is not easily detected from the current image. When it is determined that the image information analysis value is greater than the second analysis value, the photographing apparatus 100 may move to operation S1340.

In operation S1340, the photographing apparatus 100 may control the size of the ROI to decrease. When it is determined that the image information analysis value is greater than the second analysis value, the photographing apparatus 100 may control the size of the ROI to allow the image information analysis value to be smaller than the second analysis value. For example, when it is determined that the image information analysis value is greater than the second analysis value, the photographing apparatus 100 may reduce the size of the ROI. That is, the photographing apparatus 100 may reduce the size of the ROI without changing the number of added pixels, thereby controlling a signal of the focus detection region.

As a result, when the image information analysis value is smaller than the first analysis value or greater than the second analysis value, the photographing apparatus 100 may determine that the focus is not easily detected. The photographing apparatus 100 may control the size of the ROI.

FIGS. 14A and 14B are diagrams illustrating an example of controlling a size of an ROI 1401 based on an image of a subject according to an example embodiment.

FIGS. 14A and 14B illustrate detection of a focus through face detection when the subject is human being.

Upon comparing the subject of FIG. 14A and the subject of FIG. 14B, a size of a face of the subject detected in FIG. 14A is smaller than the ROI 1401, whereas a size of a face of the subject detected in FIG. 14B is bigger than the ROI 1401.

As illustrated in FIG. 14B, when the size of the face of the subject is bigger than the ROI 1401, the photographing apparatus 100 may increase the size of the ROI 1401. The photographing apparatus 100 may increase an addition range of a phase difference pixel simultaneously with the increase in the size of the ROI 1401.

Figure 15:
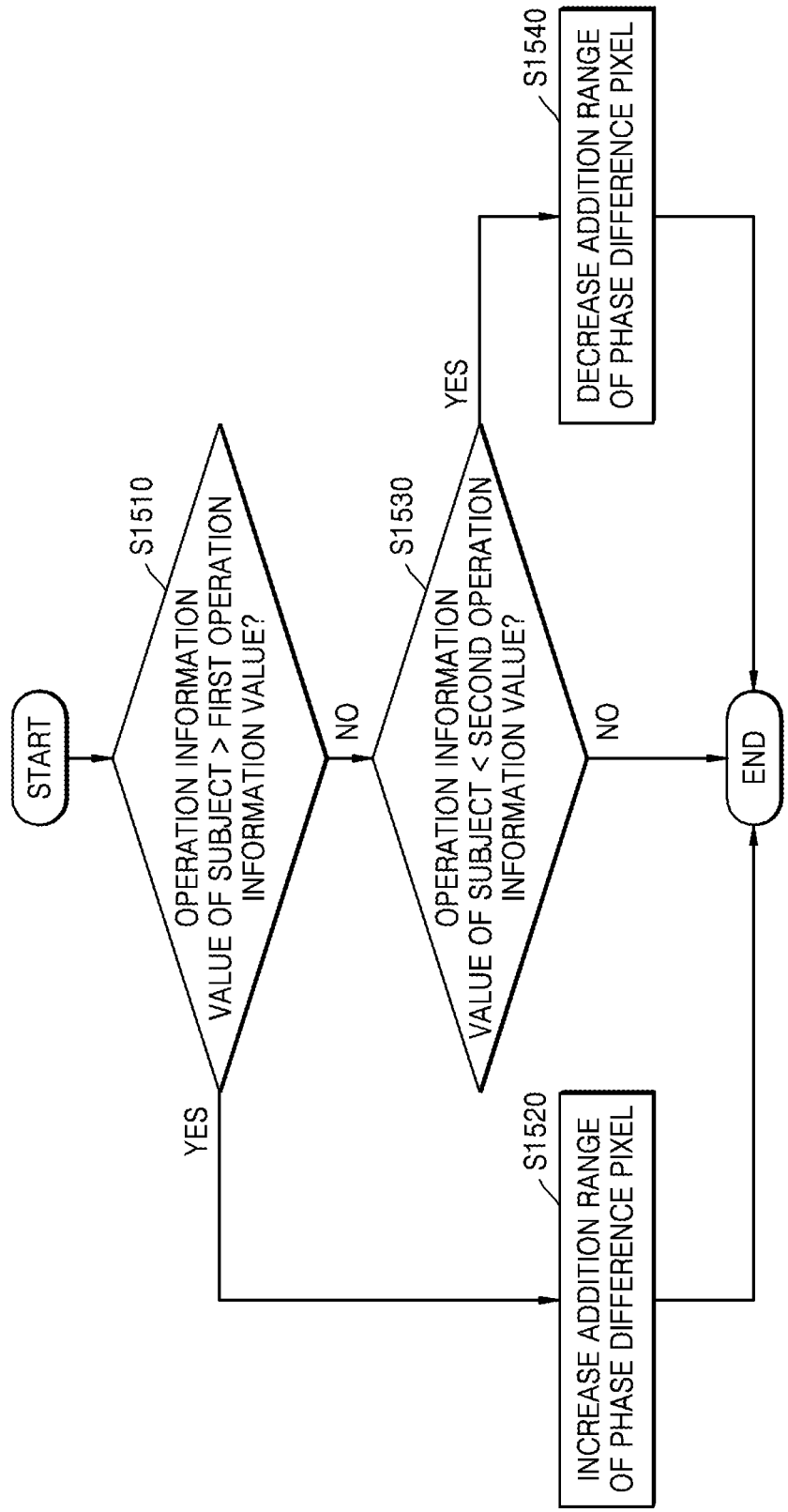
FIG. 15 is a flowchart illustrating an example method of controlling an addition range of a phase difference pixel based on an operation information analysis value of a subject performed by a photographing device according to an example embodiment.

FIG. 15 is a flowchart illustrating an example method of controlling an addition range of a phase difference pixel based on an operation information analysis value of a subject performed by the photographing apparatus 100 according to an example embodiment.

In operation S1510, the photographing apparatus 100 may compare the operation information analysis value of the subject and a first operation information analysis value. In this regard, the first operation information analysis value may be a reference value determining whether a focus is detected while the subject moves. For example, when it is determined that the operation information analysis value of the subject is greater than the first operation information analysis value, the photographing apparatus 100 may determine that the focus is not easily detected from a current image. When it is determined that the operation information analysis value of the subject is greater than the first operation information analysis value, the photographing apparatus 100 may move to operation S1520. When it is determined that the operation information analysis value of the subject is smaller than the first operation information analysis value, the photographing apparatus 100 may move to operation S1530. That is, when the operation information analysis value of the subject corresponds to a previously determined operation information analysis value, the photographing apparatus 100 may determine that the subject moves. Accordingly, the photographing apparatus 100 may determine that the focus is not easily detected from the current image.

In this regard, the operation information analysis value of the subject may be acquired from an operation vector detected through a sensor included in the photographing apparatus 100. For example, the photographing apparatus 100 may include at least one of a magnetic sensor, an acceleration sensor, an infrared sensor, a gyroscope sensor, a location sensor (e.g. a GPS), a proximity sensor, and an RGB (illuminance) sensor, in order to acquire the operation information analysis value of the subject but is not limited thereto.

The proximity sensor may detect an object approaching the photographing apparatus 100 or whether an object is present near the photographing apparatus 100 without any touch contact therebetween. The proximity sensor may detect a proximity object based on a change in an alternating magnetic field or a still magnetic field or a variation in a capacitance. Two or more proximity sensors may be provided according to a type of the photographing apparatus 100.

The gyroscope sensor may be a sensor configured to measure an angular speed and detect a direction that moves with respect to a reference direction.

Functions of other sensors may be intuitively inferred by one of ordinary skill in the art form titles of the sensors, and thus detailed descriptions are omitted.

In operation S1520, the photographing apparatus 100 may control the addition range of the phase difference pixel to increase. In this regard, the addition range of the phase difference pixel may refer, for example, to a range of adding a pixel outputting an image signal in order to control a focus detection region. When it is determined that the operation information analysis value of the subject is greater than the first operation information analysis value, the photographing apparatus 100 may control the addition range of the phase difference pixel to allow the operation information analysis value of the subject to be smaller than the first operation information analysis value. For example, when it is determined that the operation information analysis value of the subject is greater than the first operation information analysis value, the photographing apparatus 100 may increase the number of added pixels.

In operation S1530, the photographing apparatus 100 may compare the operation information analysis value of the subject and a second operation information analysis value. In this regard, the second analysis value may be the reference value determining easiness of detection of the focus while the subject moves. For example, when it is determined that the operation information analysis value of the subject is smaller than the second operation information analysis value, the photographing apparatus 100 may determine that the detection of the focus is not easy. When it is determined that the operation information analysis value of the subject is smaller than the second operation information analysis value, the photographing apparatus 100 may move to operation S1540.

In operation S1540, the photographing apparatus 100 may control the addition range of the phase difference pixel to decrease. In this regard, the addition range of the phase difference pixel may refer, for example, to the range of adding the pixel outputting the image signal in order to control the focus detection region. When it is determined that the operation information analysis value of the subject is smaller than the second operation information analysis value, the photographing apparatus 100 may control the addition range of the phase difference pixel to allow the operation information analysis value of the subject to be greater than the second operation information analysis value. For example, when it is determined that the operation information analysis value of the subject is smaller than the second operation information analysis value, the photographing apparatus 100 may reduce the number of added pixels. That is, added pixel output signals may be reduced, thereby controlling a signal of the focus detection region.

Figure 16A:
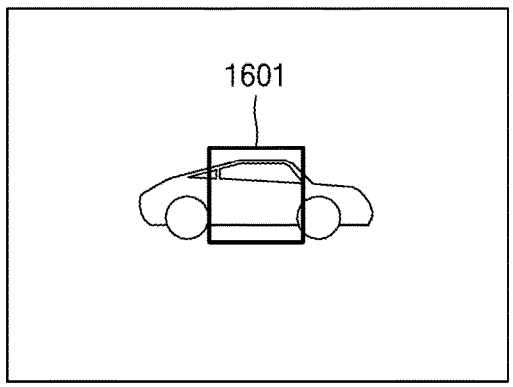
FIGS. 16A and 16B are diagrams illustrating examples of controlling an addition range of a phase difference pixel when a movement of a subject is detected according to an example embodiment.
Figure 16B:
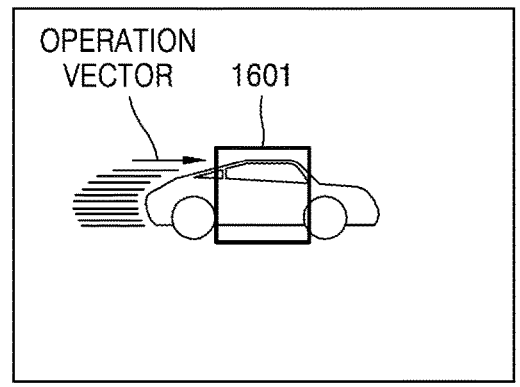

FIGS. 16A and 16B are diagrams illustrating examples of adjusting an addition range of a phase difference pixel when a movement of a subject is detected according to an embodiment.

FIG. 16A illustrates an image of a non-moving subject. FIG. 16B illustrates an image of an operation vector detected as the subject moves.

When the operation vector of the subject is detected from an image output through an image sensor as shown in FIG. 16B, the photographing apparatus 100 may increase the addition range of the phase difference pixel within an ROI 1601.

Therefore, when the movement of the subject is detected, the photographing apparatus 100 may accurately detect a focus of an image. Thus, the photographing apparatus 100 may increase reliability of detection of the focus of the image.

When the number of pixels saturated in the ROI 1601 is greater than a previously determined threshold value, the photographing apparatus 100 may adjust the number of added pixels. When pixels are saturated in the ROI 1601, the photographing apparatus 100 may not add the saturated pixels. Saturation of a pixel may refer, for example, to a saturation degree with respect to a signal threshold value of a pixel. For example, the saturation of the pixel may refer, for example, to a state wherein the pixel excessively receives a light signal, the signal threshold value is exceeded, and a signal is saturated. The photographing apparatus 100 may not add a pixel emitting a saturated signal. When the number of pixels saturated in the ROI 1601 is less than the previously determined threshold value, the photographing apparatus 100 may increase the number of added pixels.

Figure 17:
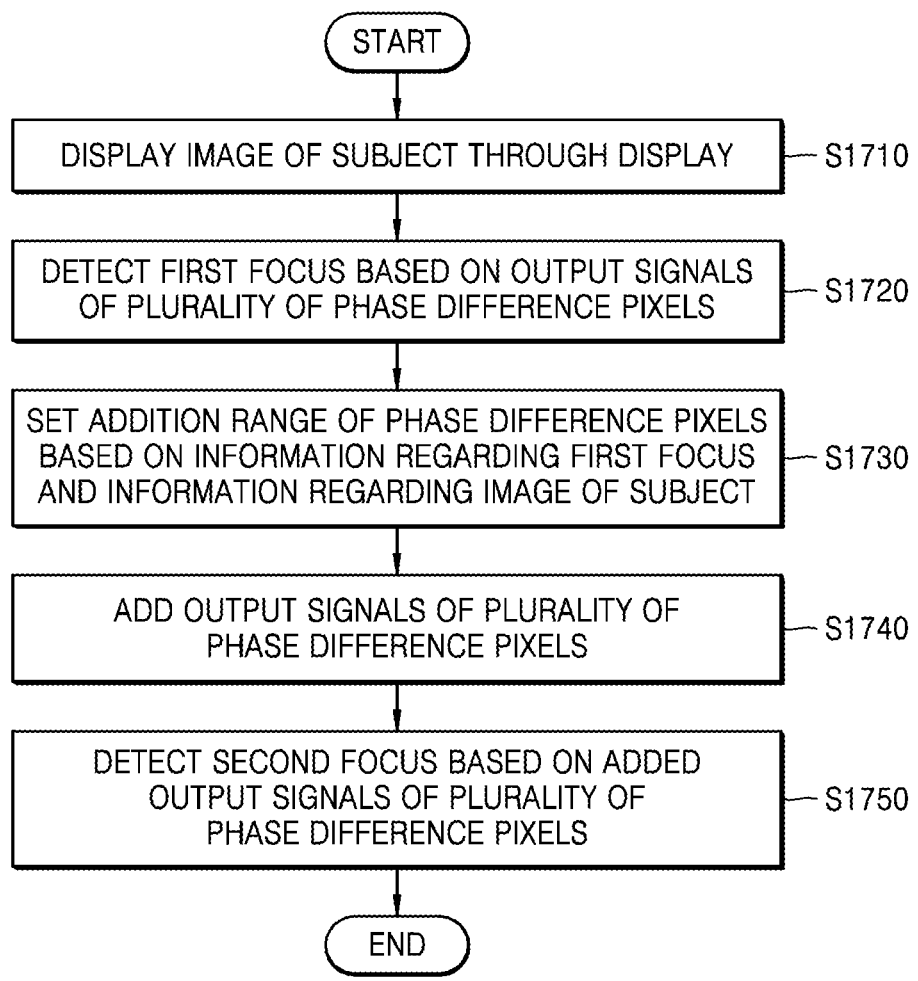
FIG. 17 is a flowchart illustrating an example method of doubly detecting focuses performed by a photographing apparatus according to an example embodiment.

FIG. 17 is a flowchart illustrating an example method of doubly detecting focuses performed by the photographing apparatus 100 according to an example embodiment.

In operation S1710, the photographing apparatus 100 may display an image of a subject through a display. In this regard, the display may be a display apparatus included in or connected to the photographing apparatus 100. The photographing apparatus 100 may display an image output by the image processor 119 through the display. For example, the photographing apparatus 100 may display a preview image on a preview screen.

In operation S1720, the photographing apparatus 100 may detect a first focus based on output signals of a plurality of phase difference pixels. The photographing apparatus 100 may detect the first focus based on a current setting state of the photographing apparatus 100. The photographing apparatus 100 may determine whether the first focus corresponds to a previously determined focus detection range. For example, the photographing apparatus 100 may determine accuracy of the first focus through a disparity determined based on image signals output from the phase difference pixels.

In operation S1730, the photographing apparatus 100 may set an addition range of the phase difference pixels based on information regarding the first focus and information regarding the image of the subject. For example, the photographing apparatus 100 may determine whether to increase or reduce the addition range of the phase difference pixels based on the disparity as the information regarding the first focus.

In operation S1740, the photographing apparatus 100 may add the output signals of the plurality of phase difference pixels. The photographing apparatus 100 may add pixels with respect to the addition range of the phase difference pixels determined according to a current image state and the first focus.

In operation S1750, the photographing apparatus 100 may detect a second focus based on the added output signals of the phase difference pixels. The photographing apparatus 100 may detect the second focus based on the added output signals according to a frequency of the subject, illuminance of the image, reliability and accuracy of the first focus, a current state of the subject, etc.

Figure 18B:
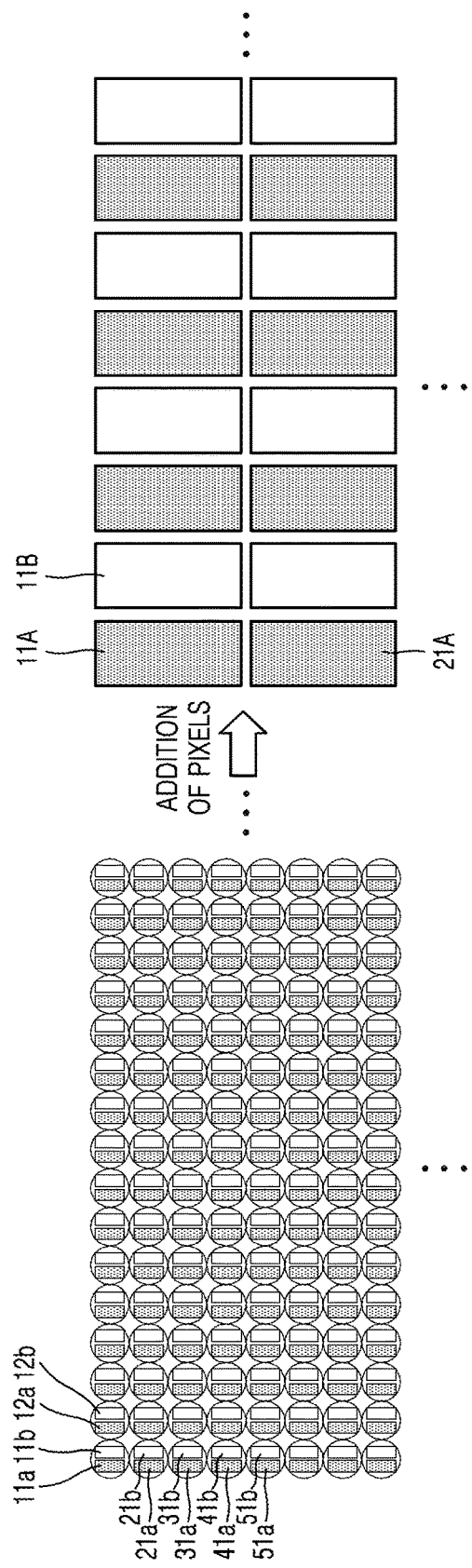

FIGS. 18A and 18B are diagrams illustrating an example of addition of output signals of phase difference pixels according to an example embodiment.

An example of a phase difference pixel including a pair of photodiodes sharing one micro lens is described with reference to FIGS. 18A and 18B.

In FIGS. 18A and 18B, photodiodes 11a and 11b form a pair of photodiodes in a phase difference pixel.

As illustrated in FIG. 18A, an output signal value of a phase difference pixel to which four pixels are added in a horizontal direction may be detected.

Symbols indicating pixels in the drawings below are in the order of (row, column). Although reference numerals are omitted in the drawings, symbols are described based on a general order of the rows and columns.

For example, in a phase difference pixel (11A, 11B) in a figure in the right side, a signal output from the phase difference pixel (11A, 11B) is a signal adding output signals of phase difference pixels (11a, 11b), (21a, 21b), (31a, 31b), and (41a, 41b) in a figure in a left side. An addition may be performed according to Equation 2 below.

$$11A = \frac{11a + 21a + 31a + 41a}{4} \qquad \text{[Equation 2]}$$

$$11B = \frac{11b + 21b + 31b + 41b}{4}$$

As shown in FIG. 18B, an output signal value of a phase difference pixel to which four pixels are added in a horizontal direction and four pixels are added in a vertical direction may be detected.

For example, in the phase difference pixel (11A, 11B) in the figure in the right, a signal output from the phase difference pixel (11A, 11B) is a signal adding output signals of phase difference pixels (11a, 11b), (21a, 12b), (31a, 31b), (41a, 41b), (12a, 12b), (22a, 22b), (32a, 32b), (42a, 42b), (13a, 13b), (23a, 23b), (33a, 33b), (43a, 43b), (14a, 14b), (24a, 24b), (34a, 34b), (44a, 44b) in the figure in the left side. An addition may be performed according to Equation 3 below.

$$11A = \frac{11a + 12a + 13a + 14a + 21a + 22a + 23a + 24a + 31a+32a+33a+34a+41a+42a+43a+44a}{16}$$

$$11B = \frac{11b + 12b + 13b + 14b + 21b + 22b + 23b + 24b + 31b+32b+33b+34b+41b+42b+43b+44b}{16}$$

[Equation 3]

Figure 19B:
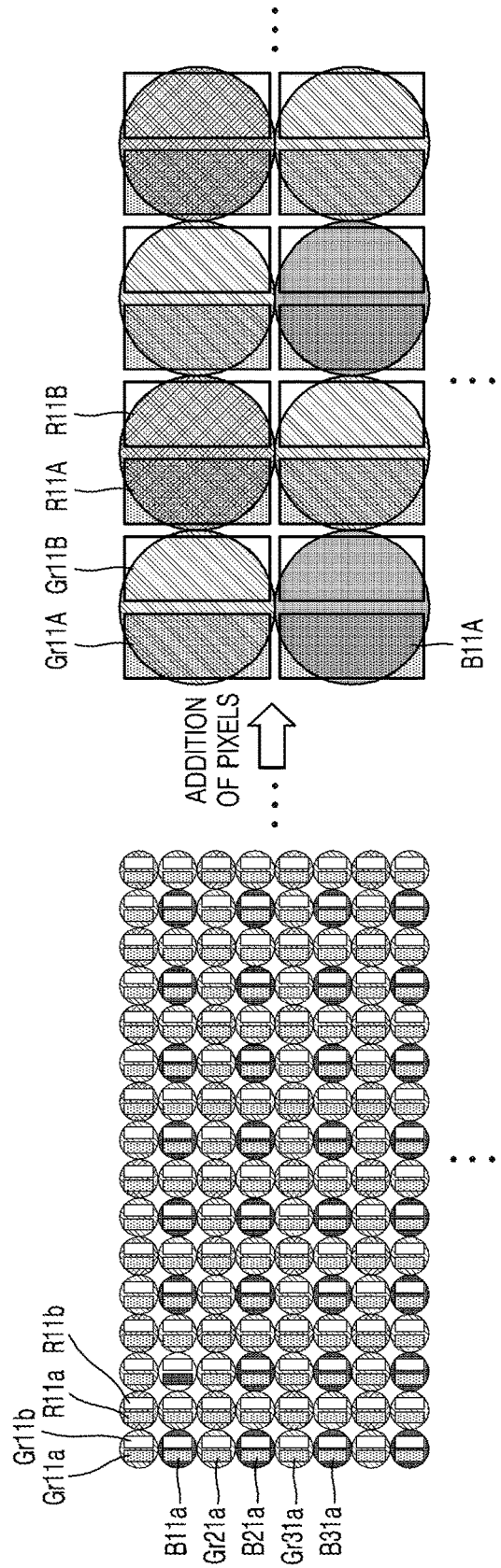

FIGS. 19A and 19B are diagrams illustrating an example of addition of output signals of phase difference pixels to which weights are added according to an example embodiment.

An example of a phase difference pixel including a pair of photodiodes sharing one micro lens is described with reference to FIGS. 19A and 19B.

In FIGS. 19A and 19B, the photodiodes 11a and 11b form a pair of photodiodes in a phase difference pixel.

The photographing apparatus 100 may add pixels by providing weights to the pixels according to colors of color filters.

The photographing apparatus 100 may determine weight coefficients based on an image signal output from the image processor 119. For example, the photographing apparatus 100 may determine the weight coefficients based on information necessary for image processing such as an illumination value, a brightness value, an exposure value, etc.

The photographing apparatus 100 may add the pixels described with respect to FIGS. 19A and 19B in the same manner as shown in FIGS. 18A and 18B. Additionally, the photographing apparatus 100 may add the pixels by providing the weight coefficients to the pixels as shown in FIGS. 19A and 19B.

In FIGS. 19A and 19B, (Gr11a, Gr11b), (R11a, R11b), (B11a, B11b), etc. are pixel reference numerals denoting colors in the pixels.

In FIG. 19A, an output signal value of a phase difference pixel to which four pixels are added in a horizontal direction may be detected. In this regard, the output signal of the phase difference pixel may be a value multiplied by a weight coefficient.

According to an embodiment, the photographing apparatus 100 may obtain an addition signal to which a weight coefficient is provided according to Equation 4 below. The photographing apparatus 100 may add four pixels to which the weights of FIG. 19A are provided in a vertical direction according to Equation 4 below, $$11A = \frac{(\alpha 1 * 11a) + (\alpha 2 * 21a) + (\alpha 1 * 31a) + (\alpha 2 * 41a)}{4}$$

[Equation 4]

$$11B = \frac{(\beta 1 * 11b) + (\beta 2 * 21b) + (\beta 1 * 31b) + (\beta 2 * 41b)}{4}$$

wherein $\alpha$ and $\beta$ are weight values determined based on information of an image.

Although a color coefficient is not used in Equation 4, when a color coefficient value of each pixel is applied, addition of pixels to which weight values are added may be performed.

The photographing apparatus 100 may add pixels to which weights are provided in a horizontal 4 direction and in a vertical 4 direction in the same manner.

The photographing apparatus 100 may detect a focus from an image of a subject based on the added pixels again. As a result, the photographing apparatus 100 may increase reliability of detection of the focus.

Methods according to an example embodiment may be embodied in the form of program instructions executable by various computing tools and recorded in a non-transitory computer-readable recording medium. The non-transitory computer-readable recording medium may include program instructions, data files, data structures, etc., alone or in combination. The program instructions recorded in the non-transitory computer-readable recording medium may be specially designed or configured for the present disclosure or may be known to and used by those of ordinary skill in the computer software art. Examples of the non-transitory computer-readable recording medium include magnetic media, such as a hard disk, a floppy disk, and a magnetic tape, optical media, such as a CD-ROM and a DVD, magneto-optical media, such as a floptical disk, and hardware devices, such as a ROM, a RAM, a flash memory, etc., specially configured to store and execute the program instructions. Examples of the program instructions include a high-level language code executable by a computer using an interpreter, etc. as well as a machine language code created by a compiler.

According to an example embodiment, an addition pixel range may be adjusted according to an image of a subject, thereby increasing the reliability of focus detection.

According to an example embodiment, a final focus may be detected based on basic focus detection information, thereby increasing the accuracy of focus detection.

According to an example embodiment, an addition of pixels may be controlled, thereby being possible to output an image signal with reduced noise.

It should be understood that the example embodiments described herein should be considered in a descriptive sense only and not for purposes of limitation. Descriptions of features or aspects within each embodiment should typically be considered as available for other similar features or aspects in other embodiments.

While one or more example embodiments have been described with reference to the figures, it will be understood by those of ordinary skill in the art that various changes in form and details may be made therein without departing from the spirit and scope as defined by the following claims.

What is claimed is:

1. A photographing apparatus configured to automatically detect a focus via a phase difference detection scheme, the photographing apparatus comprising:
   an image sensor comprising a plurality of phase difference pixels arranged in rows and columns and configured to acquire an image of a subject;
   a controller configured to:

detect focus of the image based on output signals of the plurality of phase difference pixels, set an addition range of the plurality of phase difference pixels in both a row direction and a column direction, based on information regarding the detected focus and information regarding the image, the addition range being settable to include two or more phase difference pixels in the row direction and/or in the column direction, change an attribute of a region of interest (ROI) with respect to the image based on the information regarding the detected focus and the information regarding the image; and exclude saturated pixels from the addition range of the plurality of phase difference pixels when a number of pixels saturated in the ROI is greater than a predetermined number of pixels; and an addition processor configured to add the output signals of the plurality of phase difference pixels based on the addition range.

2. The photographing apparatus of claim 1, wherein the controller is further configured to acquire information regarding a first focus based on a phase detection auto focus (PAF) reliability value, and to set the addition range of the plurality of phase difference pixels based on the information regarding the first focus and to control a focus detector to detect a second focus based on the added output signals of the plurality of phase difference pixels.

3. The photographing apparatus of claim 2, wherein the controller is configured to change the addition range of the plurality of phase difference pixels when the PAF reliability value is outside a predetermined PAF reliability range.

4. The photographing apparatus of claim 2, wherein the PAF reliability value comprises at least one of a phase detection auto focus value, a phase difference auto focus value, a phase detection auto focus signal level value, a sum of absolute differences (SAD) value, a sum of squared differences (SSD) value, a repeat pattern value, an AF reliability value, and a defocus amount value.

5. The photographing apparatus of claim 4, wherein the controller is configured to determine a disparity from a resultant value of correlation calculation, and the controller is configured to set the addition range of the plurality of phase difference pixels based on the disparity when the disparity is not equal to 0.

6. The photographing apparatus of claim 4, wherein the controller is configured to determine a curvature associated with a correlation calculation based on the SAD value, and when the curvature is less than a first curvature, the controller is configured to increase the addition range of the plurality of phase difference pixels, and when the curvature is greater than a second curvature, the controller is configured to reduce the addition range of the plurality of phase difference pixels, wherein the first curvature is a start value of a predetermined range and the second curvature is an end value of the predetermined range.

7. The photographing apparatus of claim 4, wherein the controller is configured to determine a smallest value of a correlation calculation based on the SAD value, and when the smallest value is less than a first value, the controller is configured to reduce the addition range of the plurality of phase difference pixels, and when the smallest value is greater than a second value, the controller is configured to reduce the addition range of the plurality of phase difference pixels, wherein the first smallest value is a start value of a predetermined range and the second smallest value is an end value of the predetermined range.

8. The photographing apparatus of claim 1, wherein the controller is configured to determine an information analysis value with respect to the image, and when the information analysis value with respect to the image is outside a previously determined analysis value range, the controller is configured to change the addition range of the plurality of phase difference pixels.

9. The photographing apparatus of claim 8, wherein the information analysis value with respect to the image comprises at least one of a face detection value of the subject, an operation detection value of the subject, a ratio that the subject occupies in a screen, an optical character recognition (OCR) analysis value of the subject, and an edge detection value of the subject.

10. The photographing apparatus of claim 9, wherein, when the operation detection value of the subject is less than a first operation detection value, the controller is configured to increase the addition range of the plurality of phase difference pixels, and when the operation detection value of the subject is greater than a second operation detection value, the controller is configured to reduce the addition range of the plurality of phase difference pixels.

11. The photographing apparatus of claim 8, wherein the information analysis value with respect to the image comprises at least one of illuminance of the image, an exposure time of the image, contrast of the image, and an amount of defocus of the image.

12. The photographing apparatus of claim 1, wherein the controller is configured to provide weights based on colors of the phase difference pixels.

13. The photographing apparatus of claim 2, further comprising:

a display configured to output the image.

14. The photographing apparatus of claim 13, wherein an addition range of the plurality of phase difference pixels included in the image output by the image sensor and the addition range of the plurality of phase difference pixels used by the controller to detect the second focus are different from each other.

15. A method of automatically detecting a focus via a phase difference detection scheme, the method comprising:

acquiring an image of a subject from an image sensor comprising a plurality of phase difference pixels arranged in rows and columns;

detecting focus of the image based on output signals of the plurality of phase difference pixels;

setting an addition range of the plurality of phase difference pixels in both a row direction and a column direction based on information regarding the detected focus and information regarding the image, the addition range being settable to include two or more phase difference pixels in the row direction and/or in the column direction;

changing an attribute of a region of interest (ROI) with respect to the image based on the information regarding the detected focus and the information regarding the image;

excluding saturated pixels from the addition range of the plurality of phase difference pixels when a number of pixels saturated in the ROI is greater than a predetermined number of pixels; and adding output signals of the plurality of phase difference pixels based on the addition range.

16. The method of claim 15, wherein the setting of the addition range of the plurality of phase difference pixels comprises:

acquiring information regarding a first focus based on a phase detection auto focus (PAF) reliability value and setting the addition range of the plurality of phase difference pixels based on the information regarding the first focus.

17. The method of claim 16, further comprising:

detecting a second focus based on the added output signals of the plurality of phase difference pixels based on the addition range.

18. A non-transitory computer-readable recording medium storing a program which, when executed, causes a computer to perform operations comprising:

acquiring an image of a subject from an image sensor comprising a plurality of phase difference pixels arranged in rows and columns;

detecting focus of the image based on output signals of the plurality of phase difference pixels;

setting an addition range of the plurality of phase difference pixels in both a row direction and a column direction based on information regarding the detected focus and information regarding the image, the addition range being settable to include two or more phase difference pixels in the row direction and/or the column direction;

changing an attribute of a region of interest (ROI) with respect to the image based on the information regarding the detected focus and the information regarding the image;

excluding saturated pixels from the addition range of the plurality of phase difference pixels when a number of pixels saturated in the ROI is greater than a predetermined number of pixels; and adding output signals of the plurality of phase difference pixels based on the addition range.

\* \* \* \* \*